United States Patent
Satomi et al.

(10) Patent No.: US 8,345,470 B2
(45) Date of Patent: Jan. 1, 2013

(54) SEMICONDUCTOR MEMORY DEVICE

(75) Inventors: Katsuji Satomi, Osaka (JP); Toshio Terano, Osaka (JP); Kazuhiro Takemura, Kyoto (JP); Marefusa Kurumada, Kyoto (JP)

(73) Assignee: Panasonic Corporation, Osaka (JP)

( * ) Notice: Subject to any disclaimer, the term of this patent is extended or adjusted under 35 U.S.C. 154(b) by 161 days.

(21) Appl. No.: 13/004,540

(22) Filed: Jan. 11, 2011

(65) Prior Publication Data

US 2011/0103126 A1 May 5, 2011

Related U.S. Application Data

(63) Continuation of application No. PCT/JP2009/003555, filed on Jul. 28, 2009.

(30) Foreign Application Priority Data

Aug. 1, 2008 (JP) ................................ 2008-199356

(51) Int. Cl.
G11C 11/00 (2006.01)
G11C 5/14 (2006.01)
(52) U.S. Cl. ................. 365/156; 365/154; 365/189.09
(58) Field of Classification Search .................. 365/156
See application file for complete search history.

(56) References Cited

U.S. PATENT DOCUMENTS

| | | | |
|---|---|---|---|
| 4,310,900 A | 1/1982 | Tsujide | |
| 5,621,693 A | 4/1997 | Nakase | |
| 6,380,592 B2 | 4/2002 | Tooher et al. | |
| 6,791,864 B2 | 9/2004 | Houston | |
| 6,829,179 B2 * | 12/2004 | Morikawa | 365/189.09 |
| 7,023,722 B2 * | 4/2006 | Kanehara et al. | 365/154 |
| 7,079,413 B2 * | 7/2006 | Tsukamoto et al. | 365/154 |
| 7,245,521 B2 * | 7/2007 | Mori et al. | 365/156 |
| 7,486,544 B2 * | 2/2009 | Mori et al. | 365/156 |
| 7,630,229 B2 * | 12/2009 | Katayama | 365/154 |
| 7,684,230 B2 * | 3/2010 | Yamagami et al. | 365/154 |
| 8,072,799 B2 * | 12/2011 | Maeda et al. | 365/154 |
| 8,144,536 B2 * | 3/2012 | Kobayashi | 365/203 |
| 2004/0130933 A1 | 7/2004 | Kanehara et al. | |
| 2007/0002662 A1 | 1/2007 | Yamagami et al. | |
| 2008/0151604 A1 | 6/2008 | Suzuki | |

FOREIGN PATENT DOCUMENTS

JP 55-64686 5/1980
(Continued)

OTHER PUBLICATIONS

Sayeed A. Badrudduza et al., "Six and Seven Transistor Leakage Suppressed SRAM Cells with Improved Read Stability," IEEE 2007 Custom Integrated Circuits Conference, pp. 225-228, 2007.

*Primary Examiner* — Son Mai
(74) *Attorney, Agent, or Firm* — McDermott Will & Emery LLP

(57) ABSTRACT

A control circuit supplies a word line drive voltage to one of m word lines which corresponds to a memory cell to which data is to be written, during a word line drive period including a first period and a second period following the first period, to decrease current capabilities of first and second load transistors included in the memory cell during the first period, and increase the current capabilities of the first and second load transistors during the second period.

14 Claims, 18 Drawing Sheets

FOREIGN PATENT DOCUMENTS

| | | |
|---|---|---|
| JP | 06-096589 | 4/1994 |
| JP | 06-096589 A | 4/1994 |
| JP | 07-141883 | 6/1995 |
| JP | 07-141883 A | 6/1995 |
| JP | 09-120682 | 5/1997 |
| JP | 11-213673 | 8/1999 |
| JP | 11-213673 A | 8/1999 |
| JP | 2004-199829 | 7/2004 |
| JP | 2007-12214 | 1/2007 |
| JP | 2008-176907 | 7/2008 |

* cited by examiner

SEMICONDUCTOR MEMORY DEVICE

CROSS-REFERENCE TO RELATED APPLICATIONS

This is a continuation of PCT International Application PCT/JP2009/003555 filed on Jul. 28, 2009, which claims priority to Japanese Patent Application No. 2008-199356 filed on Aug. 1, 2008. The disclosures of these applications including the specifications, the drawings, and the claims are hereby incorporated by reference in their entirety.

BACKGROUND

The technology disclosed herein relates to semiconductor memory devices including a plurality of memory cells, and more particularly, to the control of write operation of memory cells.

FIG. 17 shows a configuration of a memory cell in a typical static random access memory (SRAM). The memory cell includes load transistors QP91 and QP92, drive transistors QN91 and QN92, and access transistors QN93 and QN94. In the memory cell, the potentials of a pair of bit lines BL and /BL are previously precharged high. Data is written to the memory cell as follows. A word line WL is activated (the potential of the word line WL is caused to transition from low to high), and the potential of one of the pair of bit lines BL and /BL is caused to transition from high to low, depending on write data. As a result, the potentials of memory nodes D and ND are changed so that they are complementary, whereby the data is written to the memory cell.

In recent years, as microfabrication technology has advanced, the areas of semiconductor integrated circuits have rapidly decreased. In SRAMs, the size of each transistor included in a memory cell has been largely reduced, leading to an increase in random variations in transistor characteristics. Therefore, it is becoming difficult to ensure a margin for write operation. In general, in order to facilitate write operation (e.g., speed up write operation), it is advantageous in terms of circuit design to reduce the current capability ratio (QP91/QN93) of the load transistor QP91 to the current capability of the access transistor QN93 and the current capability ratio (QP92/QN94) of the load transistor QP92 to the current capability of the access transistor QN94. However, as these current capability ratios decrease, data holding capability (static-noise margin) decreases. If the static-noise margin is not sufficiently ensured, then when a word line is activated, the potentials of the memory nodes D and ND are likely to be reversed (i.e., data is destroyed) in a memory cell which is connected to the activated word line and to which data is not to be written. It is also becoming difficult to ensure the data holding capability due to the increase in random variations in transistor characteristics. In particular, as the threshold voltages of the access transistors QN93 and QN94 decrease due to the random variations, the current capabilities of the access transistors QN93 and QN94 increase (i.e., the current capability ratios (QP91/QN93) and (QP92/QN94) decrease), resulting in a significant degradation in the data holding capability.

As described above, the advances in microfabrication technology have made it more and more difficult to ensure both the write operation margin and the data holding capability in SRAMs. To solve such a problem, Japanese Patent Publication No. S55-64686, (Patent Document 1), Japanese Patent Publication No. 2007-012214 (Patent Document 2), etc. describe a technique of achieving more stable write operation by controlling a power supply voltage VDDM to a memory cell. In this technique, when data is written to a memory cell, the power supply voltage VDDM to the memory cell to which the data is to be written is decreased. As a result, the current capability ratios (QP91/QN93) and (QP92/QN94) decrease, resulting in an improvement in the write operation margin.

SUMMARY

It is expected that future advances in microfabrication technology will further decrease transistor sizes, leading to a further increase in random variations in transistor characteristics. Therefore, in order to provide an enough margin for write operation, it is necessary to further increase the amount of decrease in the memory cell power supply voltage. However, as the amount of decrease in the memory cell power supply voltage increases, a write failure (data re-reversal) is more likely to occur in a memory cell to which data is to be written.

Here, the write failure in a memory cell will be described with reference to FIG. 18. Here, it is assumed that, in a memory cell to which data is to be written, the potentials of the memory nodes D and ND are set to be at the low level (GND) and the high level (VDD), respectively.

At time t91, the potential of the word line WL transitions from low to high, and the potential of the bit line /BL transitions from high to low. Also, the voltage level of the memory cell power supply voltage VDDM is decreased from the power supply voltage VDD to a power supply voltage VDDL. As a result, the current capability ratio (QP92/QN94) decreases, and therefore, the potential of the memory node ND is quickly decreased from the high level to the low level. On the other hand, the potential of the memory node D gradually increases due to the access transistor QN93. In this case, however, the potential of the memory node D does not exceed an intermediate potential V91 which is a potential obtained by subtracting the threshold voltage of the access transistor QN93 from the potential of the word line WL. Also, since the current capability of the load transistor QP91 has decreased due to the decrease of the memory cell power supply voltage VDDM, it is difficult to increase the potential of the memory node D to the memory cell power supply voltage VDDM (i.e., the power supply voltage VDDL). In particular, in the case that the threshold voltage of the load transistor QP91 increases due to the random variations, the current capability of the load transistor QP91 decreases. Therefore, it is more difficult to increase the potential of the memory node D to the power supply voltage VDDL.

As described above, since the increase in the potential of the memory node D is insufficient, the current capability of the load transistor QP92 may not be sufficiently reduced (e.g., the load transistor QP92 has a capability to increase the potential of the memory node ND to the high level). In such a situation, if the current capability of the load transistor QP91 has been considerably small (e.g., although the potential of the memory node ND is at the low level, the load transistor QP91 does not have a capability to increase the potential of the memory node D to the high level), then when, at time t92, the potential of the word line WL transitions from high to low, and the access transistors QN93 and QN94 are therefore turned off, the potentials of the memory nodes D and ND are reversed again back to the original state, i.e., a write failure occurs, as shown in FIG. 18. Such a write failure is likely to occur when there are considerably large random variations in the threshold voltages of the load transistors QP91 and QP92 (in particular, the threshold voltage of the load transistor QP91 is considerably high, and the threshold voltage of the load transistor QP92 is considerably low), or when the threshold voltages of the load transistors QP91 and QP92 are originally set to be high.

As described above, when data is written, decreasing the memory cell power supply voltage makes it easier to decrease the potential of the memory node ND (D) from the high level to the low level. It is, however, more difficult to increase the potential of the memory node D (ND) from the low level to the high level, likely leading to the write failure.

Moreover, the increase in the random variations in transistor characteristics is likely to lead to a degradation not only in the write operation margin but also in the data holding capability (static-noise margin). The data holding capability is effectively improved by causing the high-level potential of the word line to be lower than the memory cell power supply voltage (the memory cell power supply voltage having a non-decreased voltage level). However, as the high-level potential of the word line decreases, it is more difficult to increase the potential of the memory node D (ND) of a memory cell to which data is to be written from the low level to the high level, likely leading to the write failure.

The present disclosure describes implementations of a semiconductor memory device which can ensure the write operation margin and reduce the write failure (data re-reversal).

An example semiconductor memory device includes n pairs, n being an integer of two or more, of bit lines, m word lines, m being an integer of two or more, n×m memory cells provided at intersections of the n pairs of bit lines and the m word lines, and a control circuit. Each of the n×m memory cells includes a first access transistor coupled between one of the pair of bit lines corresponding to the memory cell and a first memory node of the memory cell, a second access transistor coupled between the other of the pair of bit lines corresponding to the memory cell and a second memory node of the memory cell, a first load transistor and a second load transistor coupled between a power supply node of the memory cell to which a memory cell power supply voltage is applied, and the first and second memory nodes of the memory cell, respectively, and a first drive transistor and a second drive transistor coupled between a ground node of the memory cell to which a memory cell ground voltage is applied, and the first and second memory nodes of the memory cell, respectively. In each of the n×m memory cells, the first and second access transistors each have a gate coupled to one of the m word lines which corresponds to the memory cell, the first load transistor and the first drive transistor each have a gate coupled to the second memory node of the memory cell, and the second load transistor and the second drive transistor each have a gate coupled to the first memory node of the memory cell. The control circuit supplies a word line drive voltage to one of the m word lines which corresponds to one or more of the n×m memory cells to which data is to be written during a word line drive period including a first period and a second period following the first period, to decrease current capabilities of the first and second load transistors included in the memory cell during the first period, and increase the current capabilities of the first and second load transistors during the second period. In the semiconductor memory device, the potential of the memory node of the memory cell to which data is to be written can be quickly decreased during the first period, whereby the write operation margin can be ensured. Also, the potential of the memory node of the memory cell to which data is to be written can be increased during the second period, whereby the write failure (data re-reversal) can be reduced or prevented.

Note that the word line drive voltage may be lower than a memory cell power supply voltage applied to one or more to which data is not to be written of some of the n×m memory cells which correspond to one of the m word lines to which the word line drive voltage is supplied. By such a setting, the data holding capability (static-noise margin) of the memory cell to which data is not to be written can be improved.

The control circuit does not change the current capabilities of the first and second load transistors included in one or more of the n×m memory cells to which data is not to be written and which corresponds to the same word line as that of one or more of the n×m memory cells to which data is to be written, during the first and second periods. With such an arrangement, the degradation in the data holding capability of the memory cell to which data is not to be written can be reduced or prevented.

Note that the control circuit may decrease a memory cell power supply voltage applied to the power supply node of one or more of the n×m memory cells to which data is to be written during the first period, and increase the memory cell power supply voltage during the second period.

The control circuit may increase a substrate voltage applied to substrates of the first and second load transistors included in one or more of the n×m memory cells to which data is to be written during the first period, and decrease the substrate voltage during the second period.

The control circuit may decrease a memory cell ground voltage applied to the ground node of one or more of the n×m memory cells to which data is to be written during the first period, and decrease the memory cell ground voltage during the second period.

Another example semiconductor memory device includes a plurality of memory cells each including a flip-flop circuit, and a control circuit configured to decrease a data holding capability of the flip-flop circuit included in one or more of the plurality of memory cells to which data is to be written during start of write operation, and increase the data holding capability of the flip-flop circuit during a predetermined period prior to the end of the write operation. In the semiconductor memory device, the write operation margin can be ensured, and the write failure can be reduced or prevented.

DETAILED DESCRIPTION

Figure 1:
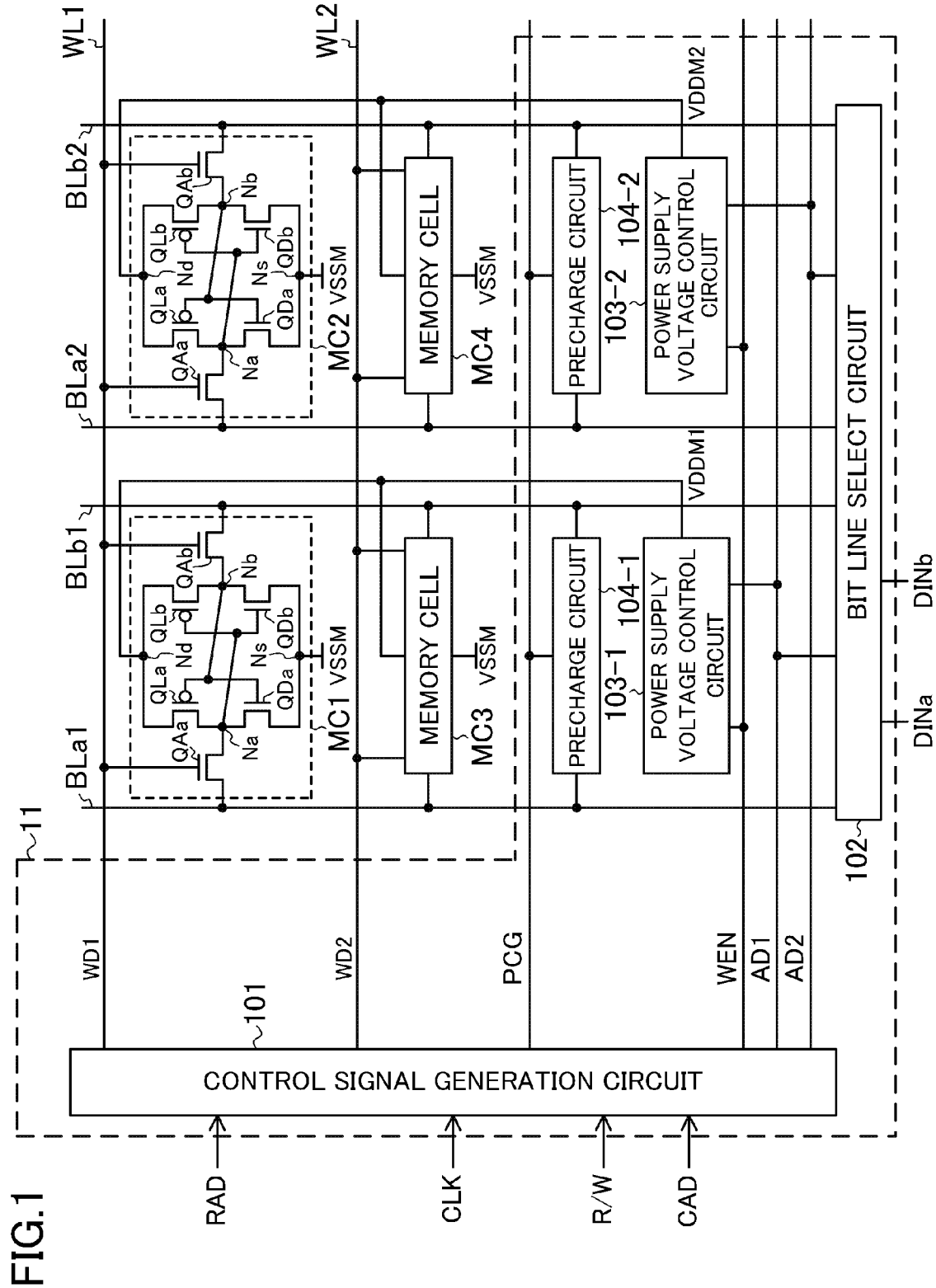
FIG. 1 is a diagram showing an example configuration of a semiconductor memory device according to a first embodiment.

Embodiments of the present disclosure will be described in detail below with reference to the accompanying drawings. In the drawings, similar reference characters refer to the same or similar elements, and the explanation thereof will be omitted.

(First Embodiment)

FIG. 1 shows an example configuration of a semiconductor memory device according to a first embodiment. The semiconductor memory device includes n pairs (n is an integer of two or more) of bit lines arranged in a column direction, m word lines (m is an integer of two or more) arranged in a row direction, n×m memory cells arranged at intersections of the n pairs of bit lines and the m word lines, and a control circuit 11. Note that, in FIG. 1, n=2 and m=2, and therefore, the semiconductor memory device includes two pairs of bit lines BLa1 and BLb1, and BLa2 and BLb2, two word lines WL1 and WL2, four memory cells MC1, MC2, MC3, and MC4, and the control circuit 11.

[Memory Cell]

The memory cell MC1 includes access transistors QAa and QAb, load transistors QLa and QLb, and drive transistors QDa and QDb. The access transistor QAa is coupled between the bit line BLa1 corresponding to the memory cell MC1 and a memory node Na of the memory cell MC1. The access transistor QAb is coupled between the bit line BLb1 corresponding to the memory cell MC1 and a memory node Nb of the memory cell MC1. The gates of the access transistors QAa and QAb are coupled to the word line WL1 corresponding to the memory cell MC1. The load transistors QLa and QLb are coupled between a power supply node Nd (a node to which a memory cell power supply voltage VDDM1 is applied) of the memory cell MC1 and the memory nodes Na and Nb, respectively. The drive transistors QDa and QDb are coupled between a ground node Ns (a node to which a memory cell ground voltage VSSM (e.g., a ground voltage GND) is applied) of the memory cell MC1 and the memory nodes Na and Nb, respectively. The gates of the load transistor QLa and the drive transistor QDa are coupled to the memory node Nb, and the gates of the load transistor QLb and the drive transistor QDb are coupled to the memory node Na. Thus, the load transistor QLa and the drive transistor QDa constitute a single inverter, and the load transistor QLb and the drive transistor QDb constitute another inverter. These inverters are cross-coupled to form a flip-flop circuit (the output terminal (memory node Na or Nb) of each inverter is coupled to an input terminal of the other terminal). Note that the memory cells MC2, MC3, and MC4 have a configuration similar to that of the memory cell MC1.

[Control Circuit]

The control circuit 11 includes a control signal generation circuit 101, a bit line select circuit 102, power supply voltage control circuits 103-1 and 103-2, and precharge circuits 104-1 and 104-2.

<<Control Signal Generation Circuit>>

Figure 2:
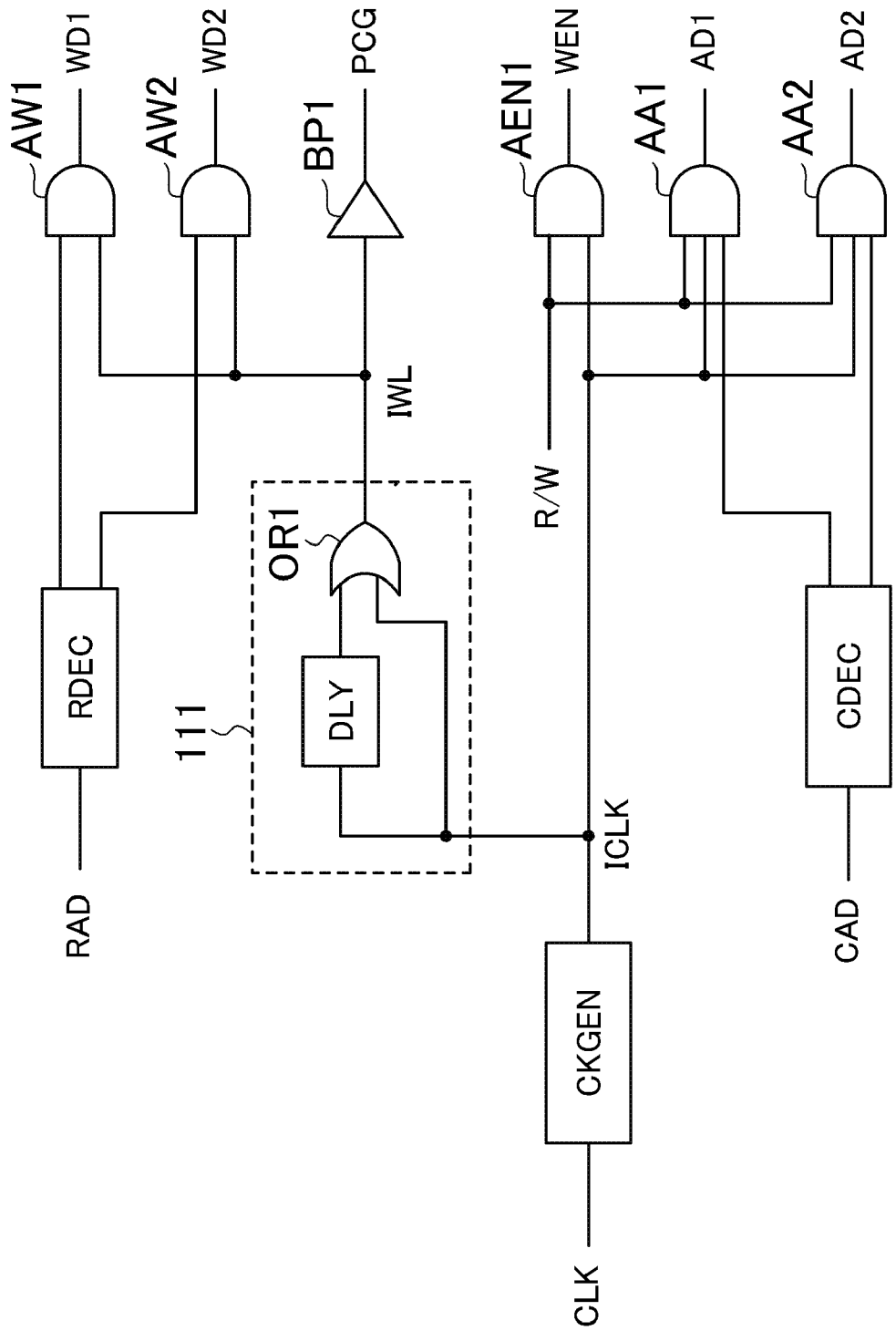
FIG. 2 is a diagram showing an example configuration of a control signal generation circuit shown in FIG. 1.

The control signal generation circuit 101 receives a clock signal CLK, a row address input signal RAD, a column address input signal CAD, and a read/write select signal R/W, and outputs word line drive voltages WD1 and WD2, a precharge control signal PCG, a write enable control signal WEN, and column address signals AD1 and AD2. For example, as shown in FIG. 2, the control signal generation circuit 101 includes an internal clock generation circuit CKGEN, an internal word line signal generation circuit 111, a row decoder RDEC, AND circuits AW1 and AW2, a buffer circuit BP1, a column decoder CDEC, and AND circuits AEN1, AA1, and AA2. Note that, in FIG. 2, the circuits in the read system are not shown for the sake of simplicity.

The internal clock generation circuit CKGEN generates an internal clock signal ICLK based on rising edges of the clock signal CLK. The high-level period of the internal clock signal ICLK has a constant length and does not depend on the length of the high-level period of the clock signal CLK. The internal word line signal generation circuit 111 generates an internal word line signal IWL based on the internal clock signal ICLK. The high-level period of the internal word line signal IWL is longer than that of the internal clock signal ICLK. For example, the internal word line signal generation circuit 111 includes a delay circuit DLY which delays the internal clock signal ICLK, and an OR circuit OR1 which performs a logical OR operation of the internal clock signal ICLK and the output of the delay circuit DLY and then outputs the result as the internal word line signal IWL. In this case, the high-level period of the internal word line signal IWL is equal to the sum of the high-level period of the internal clock signal ICLK and a delay time in the delay circuit DLY.

The row decoder RDEC supplies a high-level output signal to one of the AND circuits AW1 and AW2, depending on the row address input signal RAD. For example, when the row address input signal RAD indicates an address corresponding to the word line WL1, the row decoder RDEC supplies the output signal to the AND circuit AW1. The AND circuits AW1 and AW2 perform a logical AND operation of the internal word line signal IWL and the output signal of the row decoder RDEC and then output the result as the word line drive voltages WD1 and WD2, respectively. The buffer circuit BP1 outputs the internal word line signal IWL as the precharge control signal PCG.

The column decoder CDEC supplies a high-level output signal to one of the AND circuits AA1 and AA2, depending on the column address input signal CAD. For example, when the column address input signal CAD indicates an address corresponding to the pair of bit lines BLa1 and BLb1, the column decoder CDEC supplies the output signal to the AND circuit AA1. The AND circuit AEN1 performs a logical AND operation of the read/write select signal R/W and the internal clock signal ICLK and then outputs the result as the write enable control signal WEN. The AND circuit AA1 performs a logical AND operation of the read/write select signal R/W, the internal clock signal ICLK, and the output signal of the column decoder CDEC and then outputs the result as the column address signal AD1. The AND circuit AA2 performs a logical AND operation of the read/write select signal R/W, the internal clock signal ICLK, and the output signal of the column decoder CDEC and then outputs the result as the column address signal AD2.

Figure 3:
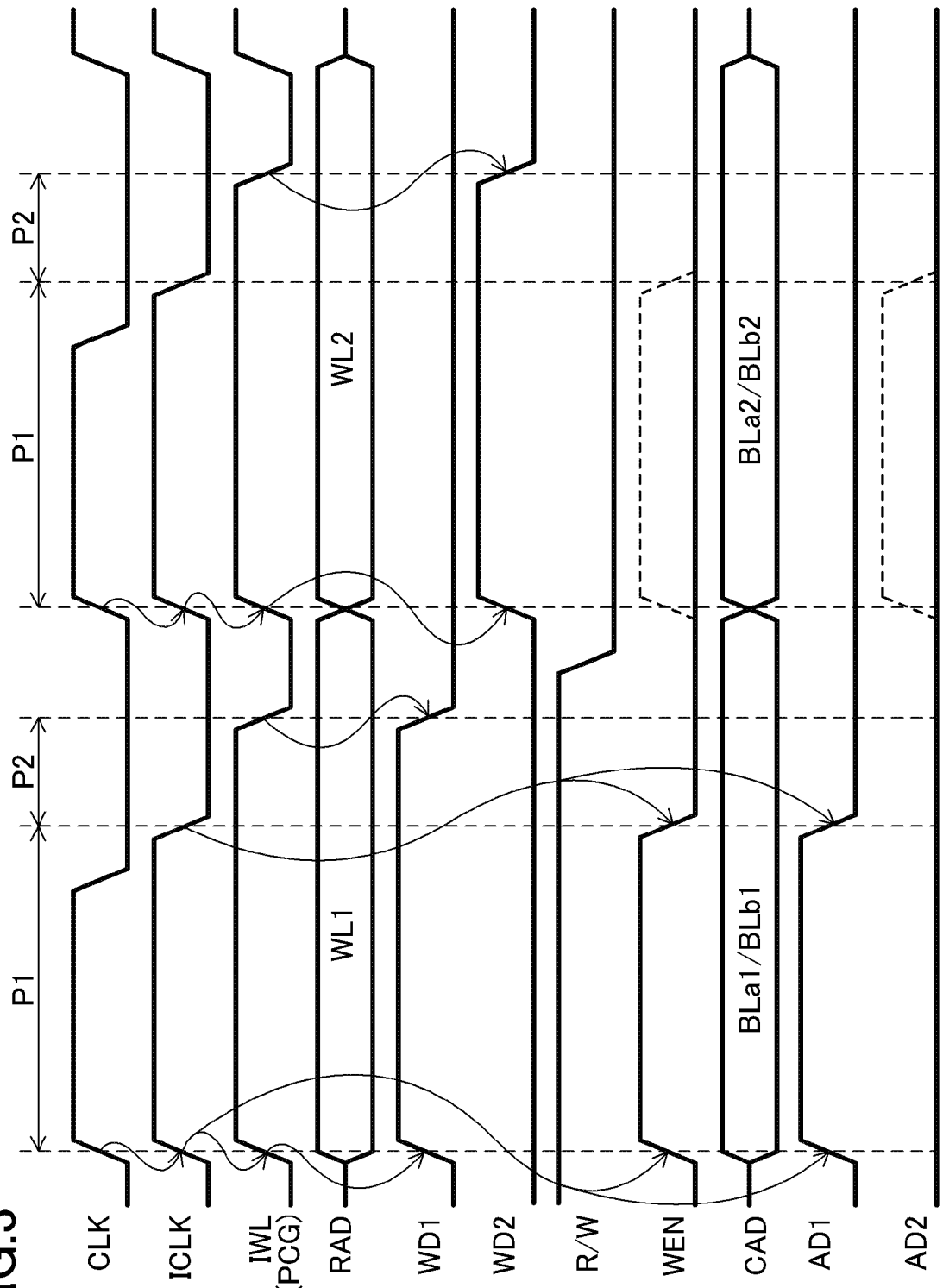
FIG. 3 is a diagram for describing operation of the control signal generation circuit of FIG. 2.

As shown in FIG. 3, the high-level periods of the word line drive voltages WD1 and WD2 and the precharge control signal PCG are equal to that of the internal word line signal IWL, and the high-level periods of the write enable control signal WEN and the column address signals AD1 and AD2 are equal to that of the internal clock signal ICLK. In other words, the high-level periods of the word line drive voltages WD1 and WD2 and the precharge control signal PCG are longer than the high-level periods of the write enable control signal WEN and the column address signals AD1 and AD2.

<<Bit Line Select Circuit>>

In response to the column address signals AD1 and AD2, the bit line select circuit 102 selects one of the pair of bit lines BLa1 and BLb1 and the pair of bit lines BLa2 and BLb2, and sets the potentials of the selected bit line pair to values corresponding to data signals DINa and DINb.

Figure 4:
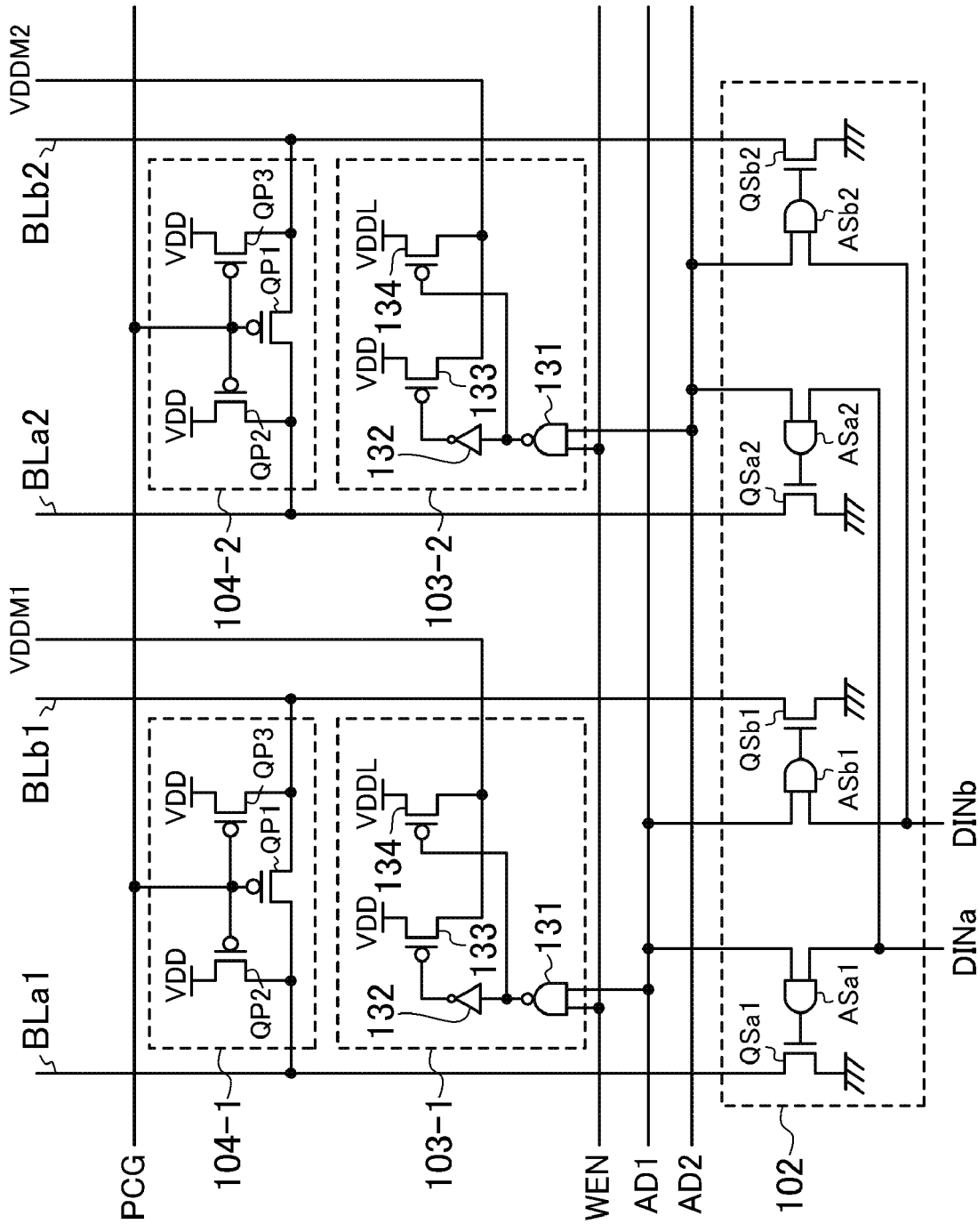
FIG. 4 is a diagram showing an example configuration of a bit line select circuit, a power supply voltage control circuit, and a precharge circuit shown in FIG. 1.

For example, as shown in FIG. 4, the bit line select circuit 102 includes AND circuits ASa1, ASb1, ASa2, and ASb2, and nMOS transistors QSa1, QSb1, QSa2, and QSb2. The AND circuit ASa1 (ASb1) performs a logical AND operation of the column address signal AD1 and the data signal DINa (DINb) and then outputs the result. The AND circuit ASa2 (ASb2) performs a logical AND operation of the column address signal AD2 and the data signal DINa (DINb) and then outputs the result. The nMOS transistors QSa1, QSb1, QSa2, and QSb2 are coupled between the bit line BLa1, BLb1, BLa2, and BLb2, respectively, and respective ground nodes, and receive the outputs of the AND circuits ASa1, ASb1, ASa2, and ASb2, respectively, at the respective gates.

<<Power Supply Voltage Control Circuit>>

The power supply voltage control circuits 103-1 and 103-2 correspond to the pair of bit lines BLa1 and BLb1 and the pair of bit lines BLa2 and BLb2, respectively, and supply memory cell power supply voltages VDDM1 and VDDM2 to the power supply nodes Nd of the memory cells MC1 and MC3 coupled to the pair of bit lines BLa1 and BLb1 and the power supply nodes Nd of the memory cells MC2 and MC4 coupled to the pair of bit lines BLa2 and BLb2, respectively. The power supply voltage control circuit 103-1 (103-2) also sets the voltage level of the memory cell power supply voltage VDDM1 (VDDM2) to be equal to one of the power supply voltage VDD and the power supply voltage VDDL (a voltage lower than the power supply voltage VDD), depending on the write enable control signal WEN and the column address signal AD1 (AD2).

For example, as shown in FIG. 4, the power supply voltage control circuits 103-1 and 103-2 each include a NAND circuit 131, an inverter 132, and pMOS transistors 133 and 134. The NAND circuit 131 performs a logical NAND operation of the write enable control signal WEN and the column address signal AD1 (AD2) and then outputs the result. The inverter 132 inverts the output of the NAND circuit 131. The pMOS transistor 133 has a source to which the power supply voltage VDD is input, a gate to which the output of the inverter 132 is input, and a drain from which the memory cell power supply voltage VDDM1 (VDDM2) is output. The pMOS transistor 134 has a source to which the power supply voltage VDDL is input, a gate to which the output of the NAND circuit 131 is input, and a drain from which the memory cell power supply voltage VDDM1 (VDDM2) is output.

<<Precharge Circuit>>

The precharge circuits 104-1 and 104-2 correspond to the pair of bit lines BLa1 and BLb1 and the pair of bit lines BLa2 and BLb2, respectively. When the precharge control signal PCG is at the low level, the precharge circuits 104-1 and 104-2 precharge the potentials of the respective corresponding bit line pairs to the high level. When the precharge control signal PCG is at the high level, the precharge circuits 104-1 and 104-2 are set to a high-impedance state in which there is not an influence on the respective corresponding bit line pairs.

For example, as shown in FIG. 4, the precharge circuits 104-1 and 104-2 each include an equalizing transistor QP1, and precharge transistors QP2 and QP3. The equalizing transistor QP1 is coupled between the bit line BLa1 (BLa2) and the bit line BLb1 (BLb2), and receives the precharge control signal PCG at the gate thereof. The precharge transistor QP2 has a source to which the power supply voltage VDD is input, a gate to which the precharge control signal PCG is input, and a drain which is coupled to the bit line BLa1 (BLa2). The precharge transistor QP3 has a source to which the power supply voltage VDD is input, a gate to which the precharge control signal PCG is input, and a drain which is coupled to the bit line BLb1 (BLb2).

[Operation]

Figure 5:
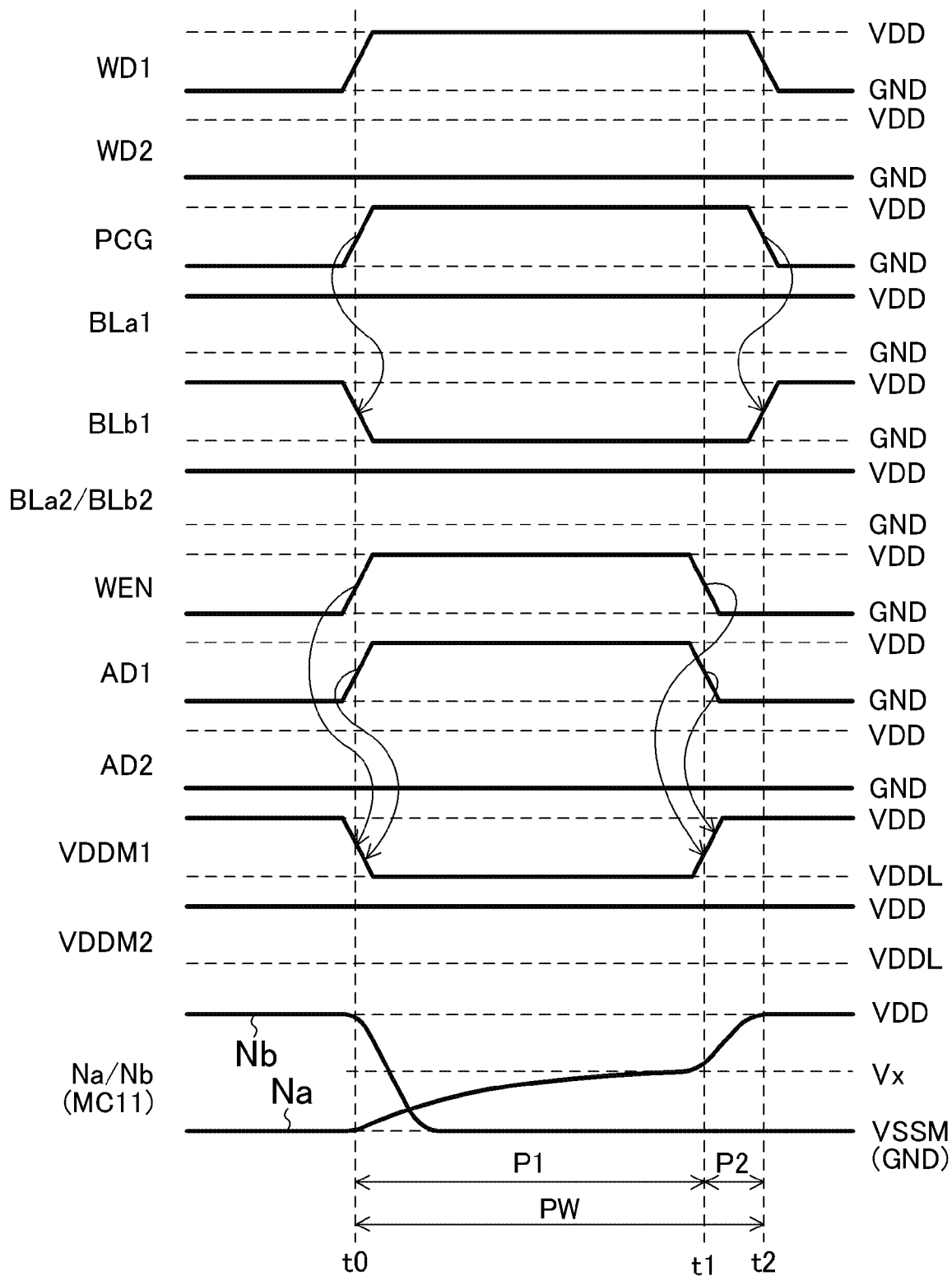
FIG. 5 is a diagram for describing operation of the semiconductor memory device of FIG. 1.

Next, write operation of the semiconductor memory device of FIG. 1 will be described with reference to FIG. 5. Here, it is assumed that data is to be written to the memory cell MC1, and in the memory cell MC1, the memory nodes Na and Nb are set to be at the low level (VSSM) and the high level (VDD), respectively, and the data signals DINa and DINb are at the low level and the high level, respectively.

Prior to time t0, the precharge control signal PCG is at the low level, and therefore, the potentials of the bit lines BLa1, BLb1, BLa2, and BLb2 are precharged high. Also, the write enable control signal WEN, and the column address signals AD1 and AD2 are all at the low level, and therefore, the voltage levels of the memory cell power supply voltages VDDM1 and VDDM2 are set to be equal to the power supply voltage VDD.

At time t0, the precharge control signal PCG transitions from low to high, so that the precharge circuits 104-1 and 104-2 transition to the high-impedance state, and the word line drive voltage WD1 transitions from low to high. Also, the column address signal AD1 transitions from low to high, so that the potential of the bit line BLb1 is decreased from the high level to the low level. Also, the write enable control signal WEN transitions from low to high, so that the voltage level of the memory cell power supply voltage VDDM1 is decreased from the power supply voltage VDD to the power supply voltage VDDL. As a result, in the memory cell MC1, the current capabilities of the load transistors QLa and QLb decrease. Specifically, the current capability ratio (QLa/QAa) of the load transistor QLa to the access transistor QAa and the current capability ratio (QLb/QAb) of the load transistor QLb to the access transistor QAb decrease. Therefore, the potential of the memory node Nb of the memory cell MC1 is quickly decreased from the high level to the low level. On the other hand, the potential of the memory node Na of the memory cell MC1 gradually increases due to the access transistor QAa, and does not exceed an intermediate potential Vx which is obtained by subtracting the threshold voltage of the access transistor QAa from the word line drive voltage WD1. Moreover, since the current capability of the load transistor QLa has been small due to the decrease of the memory cell power supply voltage VDDM1, the potential of the memory node Na may not be increased to the memory cell power supply voltage VDDM1 (i.e., the power supply voltage VDDL). In particular, as the threshold voltage of the load transistor QLa increases due to the random variations, it is more difficult to increase the potential of the memory node Na to the power supply voltage VDDL.

The column address signal AD2 is maintained at the low level, and therefore, the voltage level of the memory cell power supply voltage VDDM2 is maintained at the power supply voltage VDD. Therefore, in the memory cell MC2 (a memory cell to which data is not to be written) coupled to the word line WL1, the current capabilities of the load transistors QLa and QLb are not changed (i.e., the current capability ratios (QLa/QAa) and (QLb/QAb) do not decrease), and therefore, the degradation of the data holding capability (static-noise margin) of the memory cell MC2 can be reduced or prevented.

Next, at time t1, the precharge control signal PCG and the word line drive voltage WD1 are maintained at the high level, and therefore, the access transistors QAa and QAb are maintained in the on state. Therefore, the potentials of the pair of bit lines BLa1 and BLb1 are transferred via the access transistors QAa and QAb to the memory nodes Na and Nb, respectively. Here, the write enable control signal WEN and the column address signal AD1 transition from high to low, so that the voltage level of the memory cell power supply voltage VDDM1 is increased from the power supply voltage VDDL to the power supply voltage VDD. As a result, in the memory cell MC1, the current capabilities of the load transistors QLa and QLb increase. Specifically, the current capability ratios (QLa/QAa) and (QLb/QAb) increase. Therefore, the potential of the memory node Na of the memory cell MC1 is quickly increased to the high level (VDD) by the load transistor QLa.

Next, at time t2, the precharge control signal PCG and the word line drive voltage WD1 transition from high to low, so that the write operation of the memory cell MC1 is completed.

As described above, during a period between times t0-t2 (word line drive period PW), the control circuit 11 supplies the word line drive voltage to a word line corresponding to a memory cell to which data is to be written. Also, during a period between times t0-t1 (period P1), the control circuit 11 decreases the memory cell power supply voltage supplied to the memory cell to which data is to be written, thereby decreasing the current capabilities of the load transistors QLa and QLb included in the memory cell to which data is to be written. As a result, the potential of the memory node Nb (Na) of the memory cell to which data is to be written can be quickly decreased from the high level to the low level, whereby a write operation margin can be ensured.

Moreover, during a period between times t1-t2 (period P2), the control circuit 11 increases the memory cell power supply voltage supplied to the memory cell to which data is to be written, thereby increasing the current capabilities of the load transistors QLa and QLb included in the memory cell to which data is to be written. As a result, the potential of the memory node Na (Nb) of the memory cell to which data is to be written can be increased, whereby a write failure (data re-reversal) can be reduced or prevented.

The write failure occurs during the period P1 if the current capability of the load transistor QLb (QLa) is considerably large and the current capability of the load transistor QLa (QLb) is considerably small (e.g., the load transistor QLb (QLa) has a capability to increase the potential of the memory node Nb (Na) to the high level, and the load transistor QLa (QLb) does not have a capability to increase the potential of the memory node Na (Nb) to the high level). More specifically, the write failure occurs if there are variations in characteristics such that the current capability of the load transistor QLa (QLb) when a negative bias of the power supply voltage VDDL is applied between the gate and source thereof is lower than the current capability of the load transistor QLb (QLa) when a negative bias of a predetermined voltage (the intermediate potential Vx—the power supply voltage VDDL) is applied between the gate and source thereof. Such a situation is likely to occur when there are considerably large random variations in the threshold voltages of the load transistors QLa and QLb (in particular, the threshold voltage of the load transistor QLb (QLa) is considerably low, and the threshold voltage of the load transistor QLa (QLb) is considerably high), or when the threshold voltages of the load transistors QLa and QLb are originally set to be high. In the semiconductor memory device of FIG. 1, even in such a situation, the write failure can be reduced or prevented. In other words, the semiconductor memory device of FIG. 1 has an enhanced resistance to the random variations. Therefore, the size of each transistor included in the memory cells MC1, MC2, MC3, and MC4 can be reduced, resulting in a reduction in the circuit area of the semiconductor memory device. Moreover, the threshold voltages of the load transistors QLa and QLb can be increased, whereby standby leakage currents flowing through the load transistors QLa and QLb can be reduced or prevented. The resistance to negative bias temperature instability (NBTI) can be enhanced.

(Variation of First Embodiment)

Figure 6:
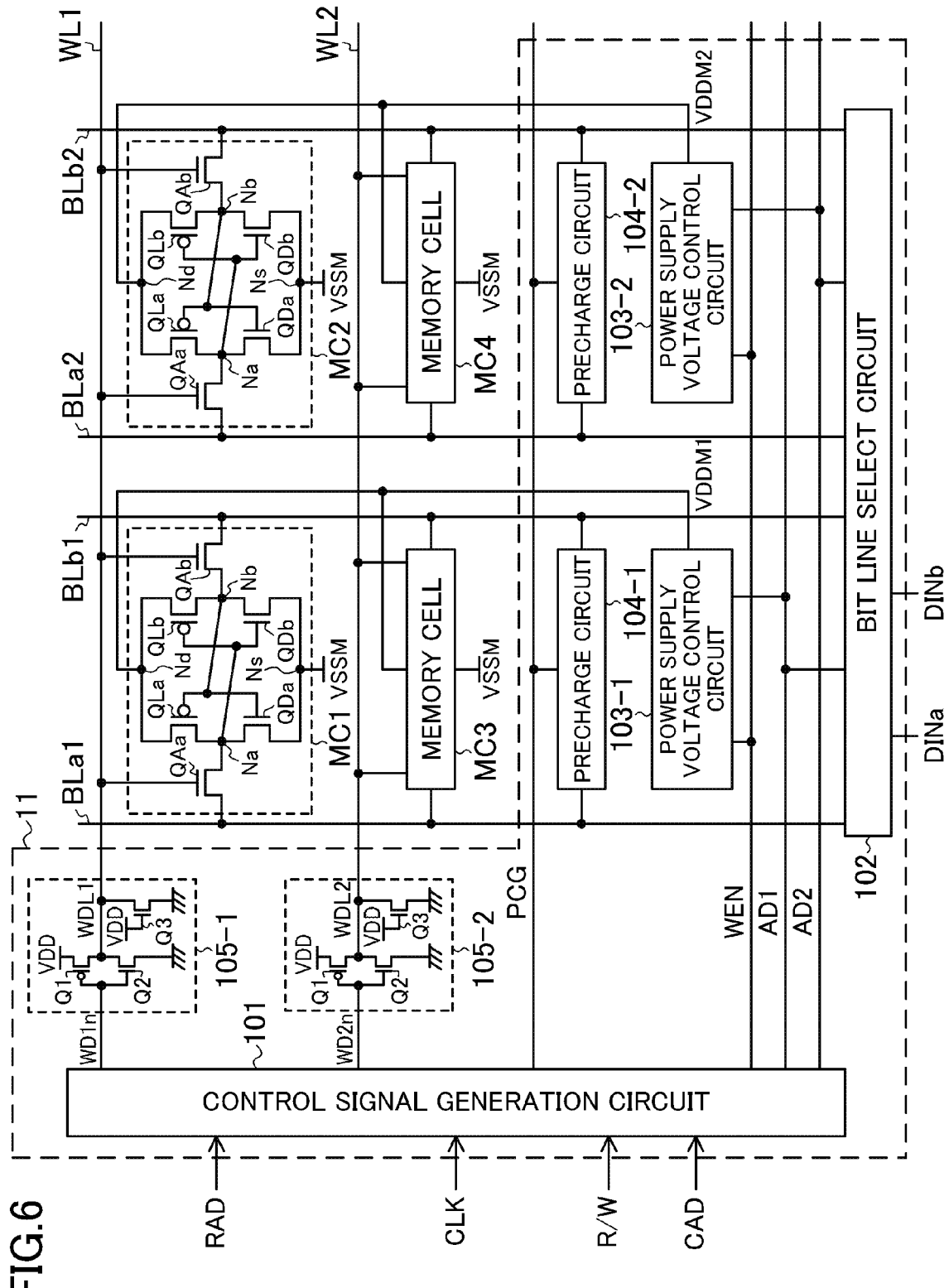
FIG. 6 is a diagram for describing a variation of the semiconductor memory device of FIG. 1.

Note that the word line drive voltage WD1 (WD2) may be lower than the memory cell power supply voltage which is applied to the power supply node Nd of one to which data is not to be written of the memory cells MC1 and MC2 (MC3 and MC4) corresponding to the word line WL1 (WL2). For example, as shown in FIG. 6, the control circuit 11 may further include word line drive circuits 105-1 and 105-2. Here, in the word line drive circuits 105-1 and 105-2, the voltage polarity is reversed, and therefore, the control signal generation circuit 101 outputs inverted voltages WD1n and WD2n of the word line drive voltages WD1 and WD2 instead of the word line drive voltages WD1 and WD2. For example, the control signal generation circuit 101 includes two NAND circuits which perform a logical NAND operation of the internal clock signal ICLK and the output signal of the row decoder RDEC and then output the result as the inverted voltages WD1n and WD2n, respectively, instead of the AND circuits AW1 and AW2 of FIG. 2.

<<Word Line Drive Circuit>>

The word line drive circuits 105-1 and 105-2 correspond to the word lines WL1 and WL2, respectively. The word line drive circuits 105-1 and 105-2 supply word line drive voltages WDL1 and WDL2 in response to the inverted voltages WD1n and WD2n from the control signal generation circuit 101, respectively. The word line drive voltage WDL1 is lower than the memory cell power supply voltage VDDM1 (or VDDM2) which is applied to the power supply node Nd of one to which data is not to be written of the memory cells MC1 and MC2 corresponding to the word line WL1. Here, the word line drive voltage WDL1 is lower than the power supply voltage VDD. This applies to the word line drive voltage WDL2.

For example, the word line drive circuits 105-1 and 105-2 each include a pMOS transistor Q1 and an nMOS transistor Q2 constituting an inverter circuit, and an the nMOS transistor Q3. The pMOS transistor Q1 and the nMOS transistor Q2 are coupled in series between a power supply node to which the power supply voltage VDD is applied and a ground node. The inverted voltage WD1n (WD2n) is applied to the gates of the pMOS transistor Q1 and the nMOS transistor Q2. The nMOS transistor Q3 is coupled between a node at which the pMOS transistor Q1 and the nMOS transistor Q2 are coupled, and a ground node. The power supply voltage VDD is applied to the gate of the nMOS transistor Q3. When the inverted voltage WD1n (WD2n) transitions from high to low, so that the word line drive voltage WDL1 (WDL2) transitions from low to high, both the pMOS transistor Q1 and the nMOS transistor Q3 are in the conductive state, and therefore, the word line drive voltage WDL1 (WDL2) is caused to be lower than the power supply voltage VDD.

In the memory cells MC1, MC2, MC3, and MC4, as the current capabilities of the access transistors QAa and QAb increase, the current capability ratios (QLa/QAa) and (QLb/QAb) decrease, and therefore, the data holding capability (static-noise margin) is degraded. In particular, as the threshold voltages of the access transistors QAa and QAb decrease due to the random variations, the data holding capability is significantly degraded. In the semiconductor memory device of FIG. 6, the word line drive voltages WDL1 and WDL2 are lower than the memory cell power supply voltage applied to a memory cell to which data is not to be written. Therefore, in one to which data is not to be written of the memory cells MC1 and MC2 (MC3 and MC4) corresponding to the word line WL1 (WL2) to which the word line drive voltage WDL1 (WDL2) is supplied, the current capabilities of the access transistors QAa and QAb can be decreased. As a result, the data holding capability of the memory cell to which data is not to be written can be improved.

In the conventional art (Patent Documents 1 and 2), as the high-level potential of a word line decreases, it is more difficult to increase the potential of a memory node of a memory cell to which data is to be written from the low level to the high level, likely leading to the write failure. On the other hand, in the semiconductor memory device of FIG. 6, as the word line drive voltage WDL1 (WDL2) decreases, the intermediate potential Vx decreases during the period P1 (i.e., it is more difficult to increase the potential of the memory node Na (Nb)). During the period P2, however, the potential of the memory node Na (Nb) is increased from the intermediate potential Vx to the high level (VDD). Therefore, the write failure can be reduced or prevented.

As described above, the write operation margin of a memory cell to which data is to be written can be improved, and the data holding capability (static-noise margin) of a memory cell to which data is not to be written can be improved.

(Second Embodiment)

Figure 7:
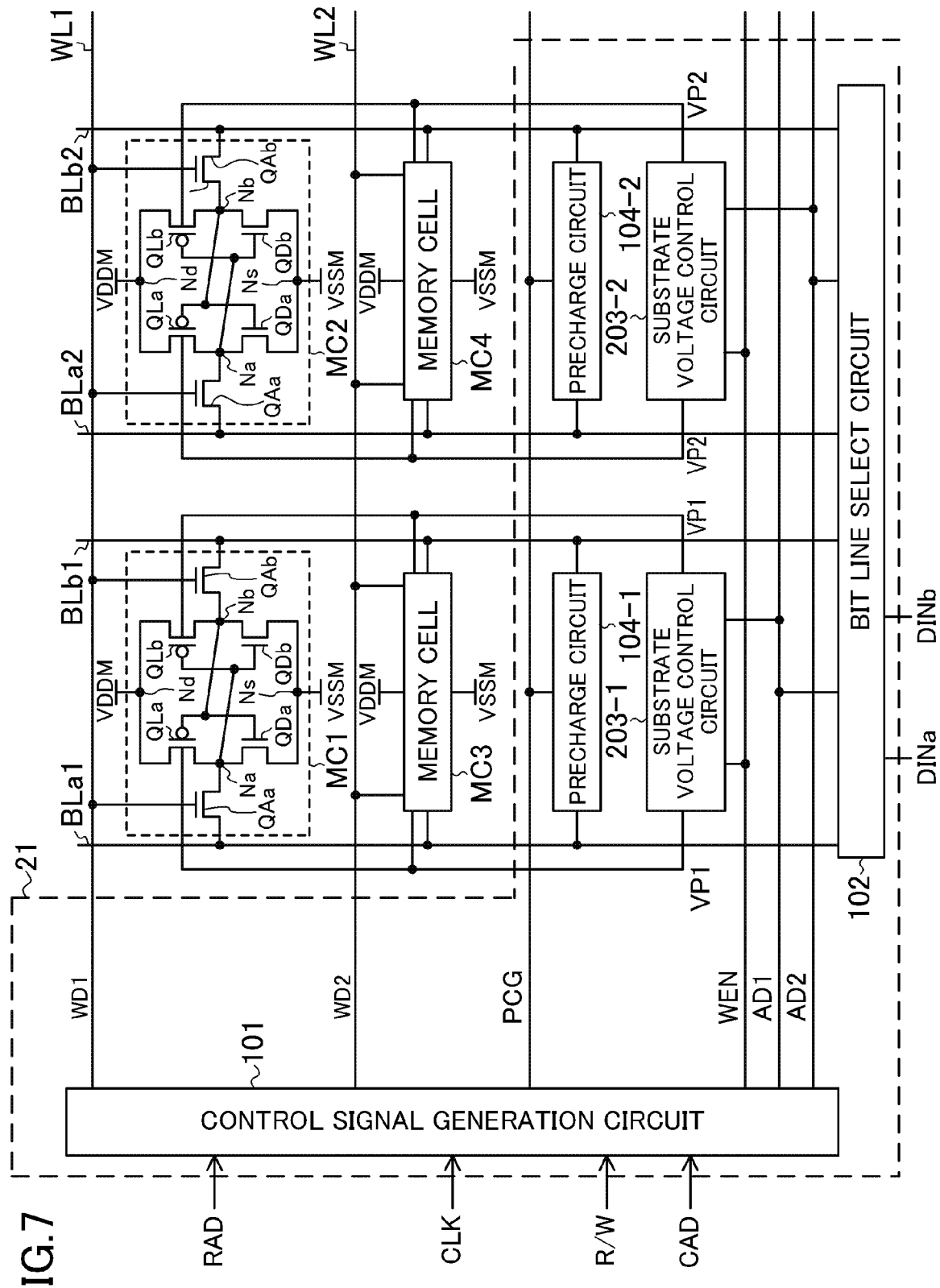
FIG. 7 is a diagram showing an example configuration of a semiconductor memory device according to a second embodiment.

FIG. 7 shows an example configuration of a semiconductor memory device according to a second embodiment. The semiconductor memory device includes a control circuit 21 instead of the control circuit 11 of FIG. 1. The control circuit 21 includes substrate voltage control circuits 203-1 and 203-2 instead of the power supply voltage control circuits 103-1 and 103-2 of FIG. 1. Note that the memory cell power supply voltage VDDM (e.g., the power supply voltage VDD) is applied to the power supply node Nd of each of the memory cells MC1, MC2, MC3, and MC4. The other configuration is similar to that of FIG. 1.

<<Substrate Voltage Control Circuit>>

The substrate voltage control circuits 203-1 and 203-2 correspond to the pair of bit lines BLa1 and BLb1 and the pair of bit lines BLa2 and BLb2, respectively. The substrate voltage control circuits 203-1 and 203-2 supply substrate voltages VP1 and VP2 to the substrates of the load transistors QLa and QLb included in the memory cells MC1 and MC3 coupled to the pair of bit lines BLa1 and BLb1 and the substrates of the load transistors QLa and QLb included in the memory cells MC2 and MC4 coupled to the pair of bit lines BLa2 and BLb2, respectively. The substrate voltage control circuit 203-1 (203-2) also sets the voltage level of the substrate voltage VP1 (VP2) to be equal to one of the power supply voltage VDD and a power supply voltage VDDH which is a voltage higher than the power supply voltage VDD, depending on the write enable control signal WEN and the column address signal AD1 (AD2).

Figure 8:
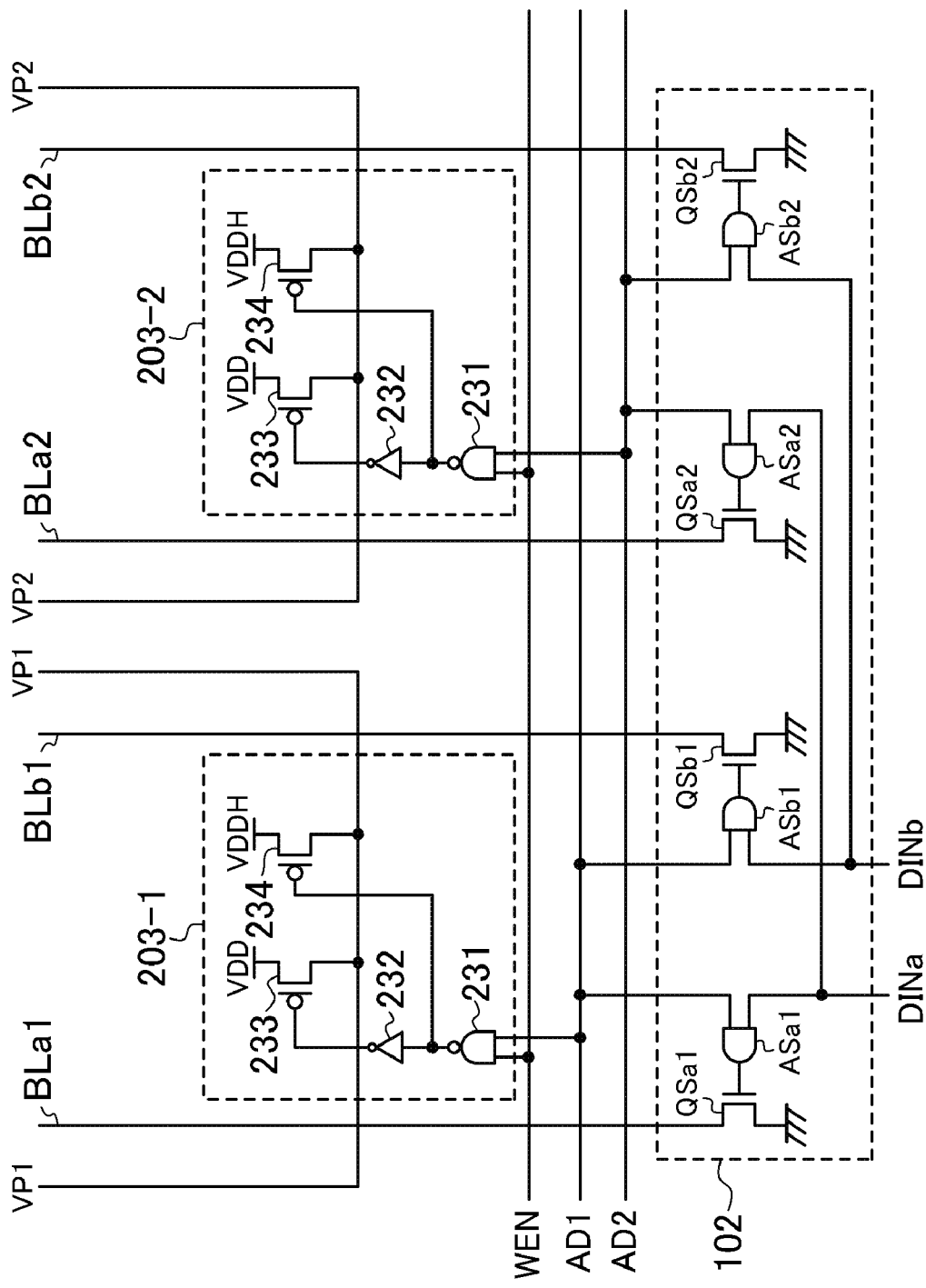
FIG. 8 is a diagram showing an example configuration of a substrate voltage control circuit shown in FIG. 7.

For example, as shown in FIG. 8, the substrate voltage control circuits 203-1 and 203-2 each include a NAND circuit 231, an inverter 232, and pMOS transistors 233 and 234. The NAND circuit 231 performs a logical NAND operation of the write enable control signal WEN and the column address signal AD1 (AD2) and then outputs the result. The inverter 232 inverts the output of the NAND circuit 231. The pMOS transistor 233 has a source to which the power supply voltage VDD is input, a gate to which the output of the inverter 232 is input, and a drain from which the substrate voltage VP1 (VP2) is output. The pMOS transistor 234 has a source to which the power supply voltage VDDH is input, a gate to which the output of the NAND circuit 231 is input, and a drain from which the substrate voltage VP1 (VP2) is output.

[Operation]

Figure 9:
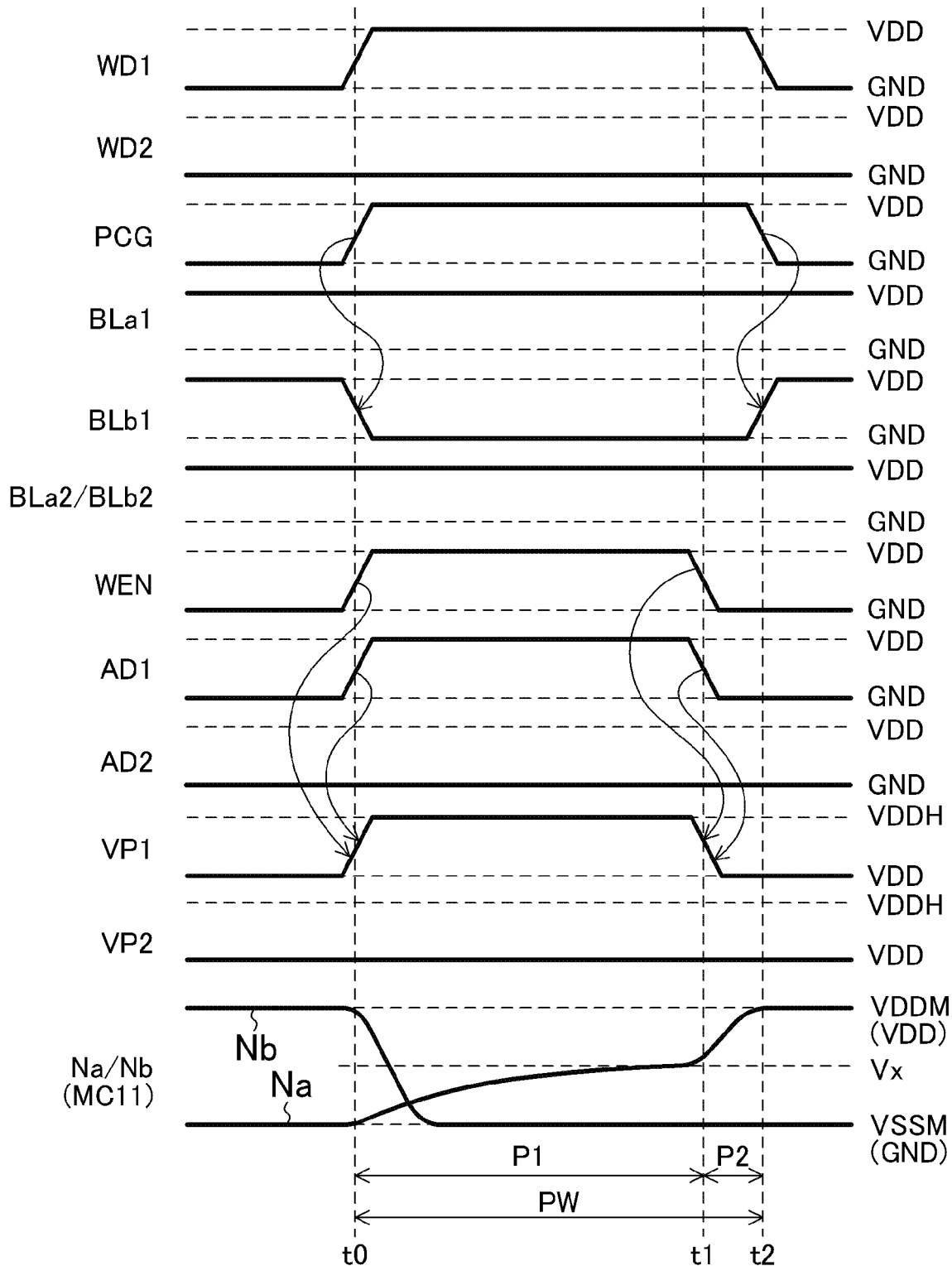
FIG. 9 is a diagram for describing operation of the semiconductor memory device of FIG. 7.

Next, write operation of the semiconductor memory device of FIG. 7 will be described with reference to FIG. 9. Here, it is assumed that the memory cell MC1 is a memory cell to which data is to be written, the memory nodes Na and Nb of the memory cell MC1 are set to be at the low level (VSSM) and the high level (VDDM), respectively, and the data signals DINa and DINb are at the low level and the high level, respectively.

At time t0, the write enable control signal WEN and the column address signal AD1 transition from low to high, so that the voltage level of the substrate voltage VP1 is increased from the power supply voltage VDD to the power supply voltage VDDH. As a result, in the memory cell MC1, the current capabilities of the load transistors QLa and QLb decrease. In other words, the current capability ratios (QLa/QAa) and (QLb/QAb) decrease. Also, since the column address signal AD2 is maintained at the low level, the voltage level of the substrate voltage VP2 is maintained at the power supply voltage VDD. Therefore, in the memory cell MC2 (a memory cell to which data is not to be written) coupled to the word line WL1, the current capabilities of the load transistors QLa and QLb are not changed. In other words, the current capability ratios (QLa/QAa) and (QLb/QAb) do not decrease.

Next, at time t1, the write enable control signal WEN and the column address signal AD1 transition from high to low, so that the voltage level of the substrate voltage VP1 is decreased from the power supply voltage VDDH to the power supply voltage VDD. As a result, in the memory cell MC1, the current capabilities of the load transistors QLa and QLb increase. In other words, the current capability ratio (QLa/QAa) and (QLb/QAb) increase.

As described above, the control circuit 21 increases the substrate voltage applied to the substrates of the load transistors QLa and QLb included in a memory cell to which data is to be written during the period P1, and decreases the substrate voltage applied to the substrates of the load transistors QLa and QLb included in the memory cell to which data is to be written during the period P2. As a result, during the period P1, the current capability ratios (QLa/QAa) and (QLb/QAb) decrease, whereby the write operation margin can be improved. During the period P2, the current capability ratios (QLa/QAa) and (QLb/QAb) increase, whereby the write failure can be reduced or prevented.

Note that the control circuit 21 of FIG. 7 may further include the power supply voltage control circuits 103-1 and 103-2 of FIG. 1 or the word line drive circuits 105-1 and 105-2 of FIG. 6.

(Third Embodiment)

Figure 10:
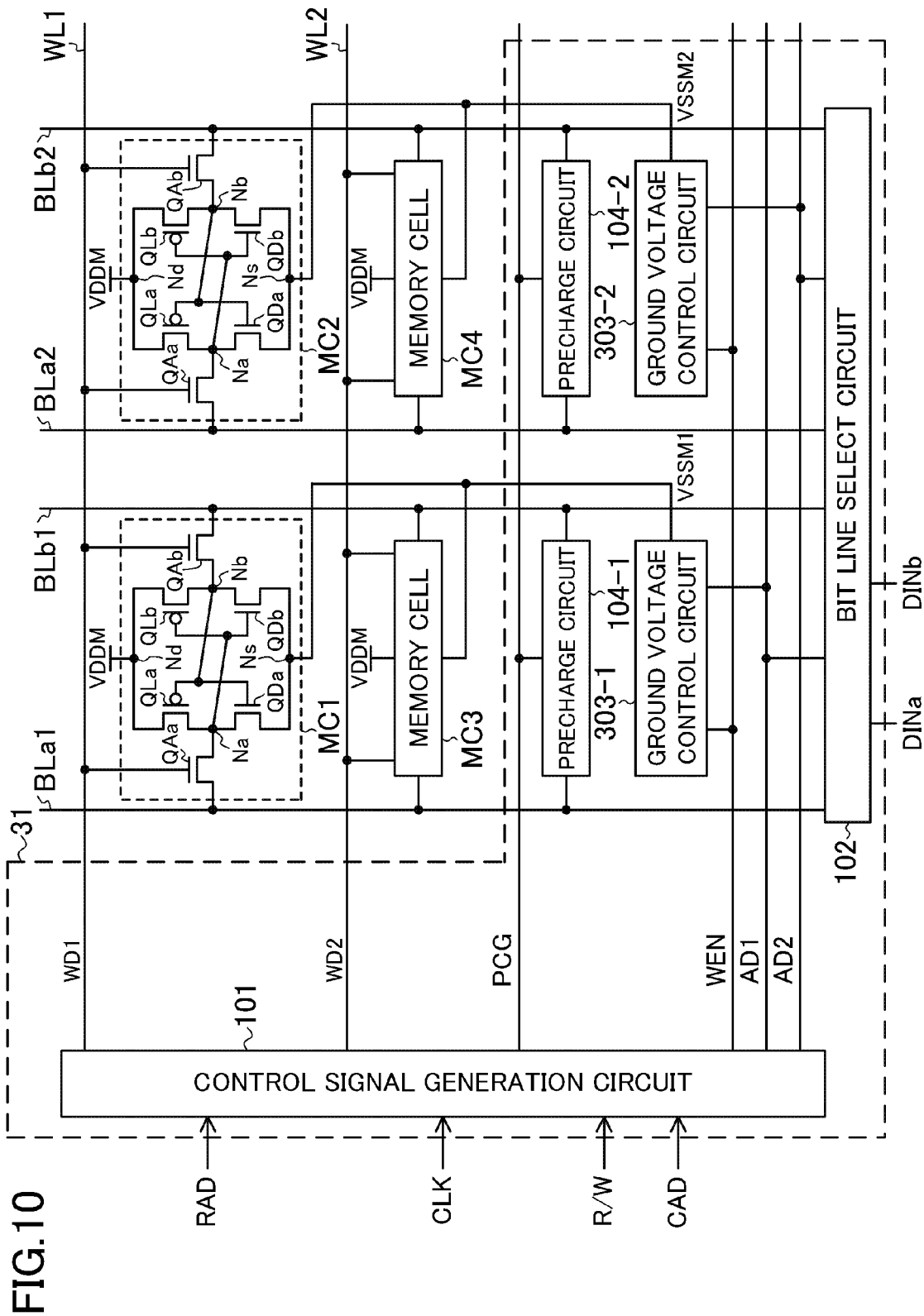
FIG. 10 is a diagram showing an example configuration of a semiconductor memory device according to a third embodiment.

FIG. 10 shows an example configuration of a semiconductor memory device according to a third embodiment. This semiconductor memory device includes a control circuit 31 instead of the control circuit 11 of FIG. 1. The control circuit 31 includes ground voltage control circuits 303-1 and 303-2 instead of the power supply voltage control circuits 103-1 and 103-2 of FIG. 1. Note that the memory cell power supply voltage VDDM (e.g., the power supply voltage VDD) is applied to the power supply node Nd of each of the memory cells MC1, MC2, MC3, and MC4. The other configuration is similar to that of FIG. 1.

<<Ground Voltage Control Circuit>>

The ground voltage control circuits 303-1 and 303-2 correspond to the pair of bit lines BLa1 and BLb1 and the pair of bit lines BLa2 and BLb2, respectively. The ground voltage control circuits 303-1 and 303-2 supply memory cell ground voltages VSSM1 and VSSM2 to the ground nodes Ns of the memory cells MC1 and MC3 coupled to the pair of bit lines BLa1 and BLb1 and the ground nodes Ns of the memory cells MC2 and MC4 coupled to the pair of bit lines BLa2 and BLb2, respectively. The ground voltage control circuit 303-1 (303-2) sets the voltage level of the memory cell ground voltage VSSM1 (VSSM2) to be equal to one of a ground voltage VSS (e.g., the ground voltage GND) and a ground voltage VSSH which is a voltage higher than the ground voltage VSS, depending on the write enable control signal WEN and the column address signal AD1 (AD2).

Figure 11:
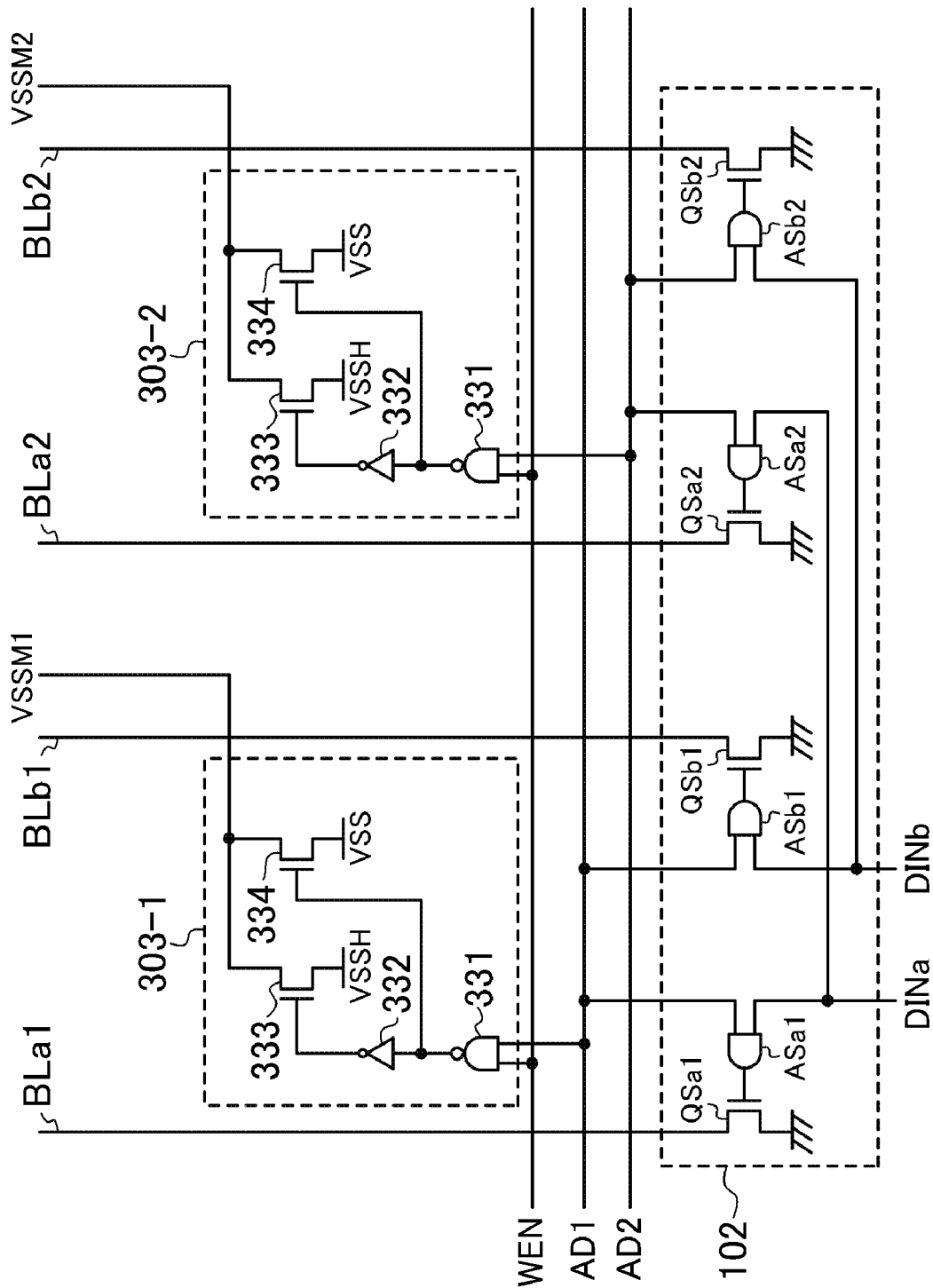
FIG. 11 is a diagram showing an example configuration of a ground voltage control circuit shown in FIG. 10.

For example, as shown in FIG. 11, the ground voltage control circuits 303-1 and 303-2 each include a NAND circuit 331, an inverter 332, and nMOS transistors 333 and 334. The NAND circuit 331 performs a logical NAND operation of the write enable control signal WEN and the column address signal AD1 (AD2) and then outputs the result. The inverter 332 inverts the output of the NAND circuit 331. The nMOS transistor 333 has a source to which the ground voltage VSSH is input, a gate to which the output of the inverter 332 is input, and a drain from which the memory cell ground voltage VSSM1 (VSSM2) is output. The nMOS transistor 334 has a source to which the ground voltage VSS is input, a gate to which the output of the NAND circuit 331 is input, and a drain from which the memory cell ground voltage VSSM1 (VSSM2) is output.

[Operation]

Figure 12:
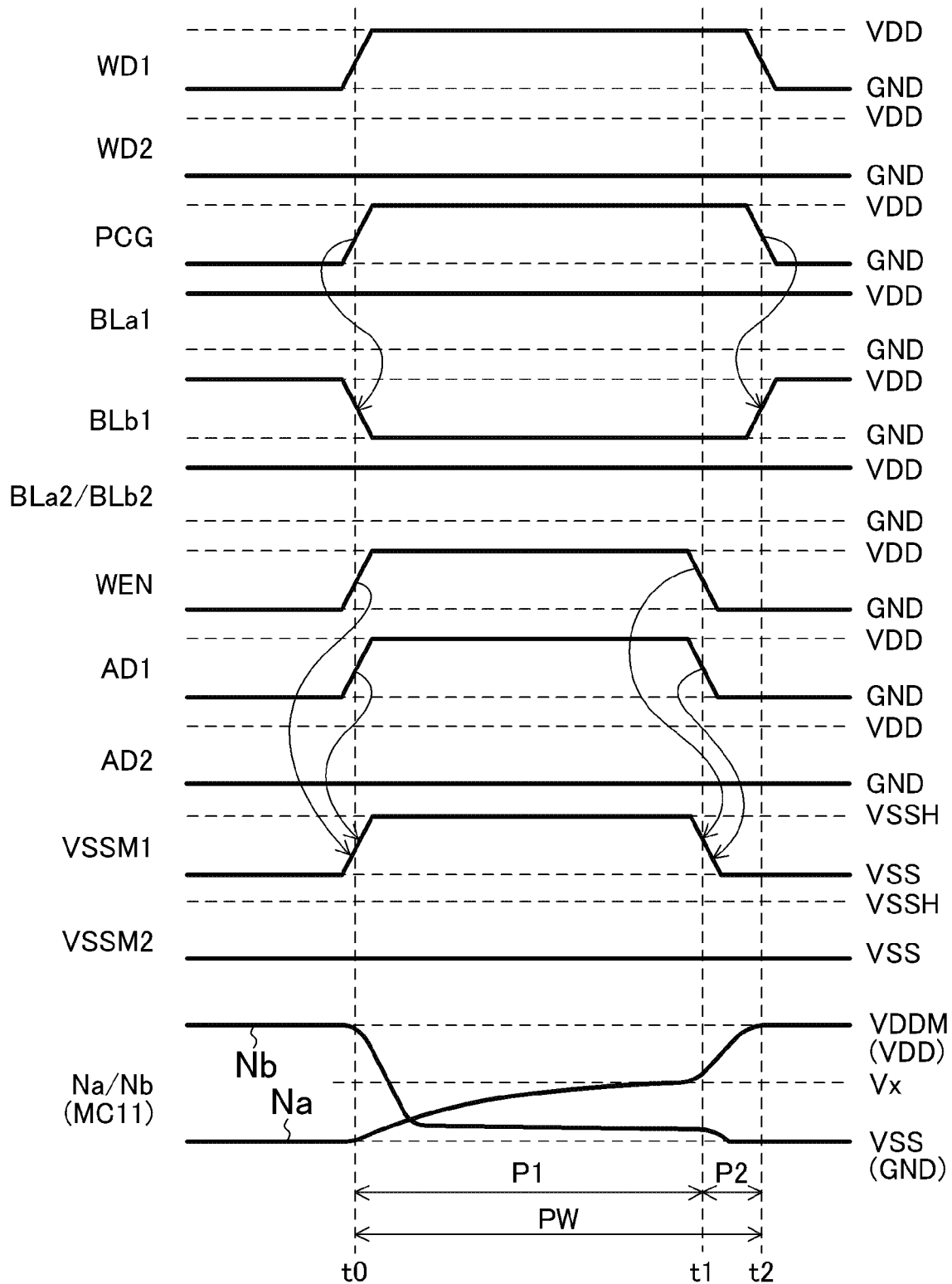
FIG. 12 is a diagram for describing operation of the semiconductor memory device of FIG. 10.

Next, write operation of the semiconductor memory device of FIG. 10 will be described with reference to FIG. 12. Here, it is assumed that the memory cell MCI is a memory cell to which data is to be written, the memory nodes Na and Nb of the memory cell MCI are set to be at the low level (VSS) and the high level (VDD), respectively, and the data signals DINa and DINb are at the low level and the high level, respectively.

At time t0, the write enable control signal WEN and the column address signal AD1 transition from low to high, so that the voltage level of the memory cell ground voltage VSSM1 is increased from the ground voltage VSS to the ground voltage VSSH. In the memory cell MC1, the memory cell ground voltage VSSM1 has been transferred via the on-state drive transistor QDa to the gate of the load transistor QLb, and therefore, the gate potential of the load transistor QLb increases due to the increase of the memory cell ground voltage VSSM1. As a result, in the memory cell MC1, the current capability of the load transistor QLb decreases (i.e., the current capability ratio (QLb/QAb) decreases), so that the potential of the memory node Nb of the memory cell MC1 is quickly decreased from the high level (VDD) to the memory cell ground voltage VSSM1 (i.e., the ground voltage VSSH). On the other hand, in the memory cell MC1, the potential of the memory node Nb is decreased to the ground voltage VSSH which is higher than the low level (VSS), so that the current capability of the load transistor QLa is smaller than that obtained when the potential of the memory node Nb is at the low level (VSS). In other words, the current capability ratio (QLa/QAa) decreases. Therefore, the potential of the memory node Na may not be increased to the high level (VDD). In particular, as the threshold voltage of the load transistor QLa increases due to the random variations, it is more difficult to increase the potential of the memory node Na to the high level.

Since the column address signal AD2 is maintained at the low level, the voltage level of the memory cell ground voltage VSSM2 is maintained at the ground voltage VSS. Therefore, in the memory cell MC2 (a memory cell to which data is not to be written) coupled to the word line WL1, the current capabilities of the load transistors QLa and QLb are not changed (i.e., the current capability ratios (QLa/QAa) and (QLb/QAb) do not decrease), and therefore, the data holding capability of the memory cell MC2 is not degraded.

Next, at time t1, the write enable control signal WEN and the column address signal AD1 transition from high to low, and the voltage level of the memory cell ground voltage VSSM1 is decreased from the ground voltage VSSH to the ground voltage VSS. As a result, the potential of the memory node Nb of the memory cell MC1 is decreased from the ground voltage VSSH to the low level (VSS), and therefore, in the memory cell MC1, the current capability of the load transistor QLa is caused to be larger than that obtained when the potential of the memory node Nb is equal to the ground voltage VSSH. In other words, the current capability ratio (QLa/QAa) increases. As a result, the potential of the memory node Na of the memory cell MCI is quickly increased to the high level (VDD) by the load transistor QLa.

As described above, the control circuit 31 increases the memory cell ground voltage applied to the ground node Ns of a memory cell to which data is to be written during the period P1, and decreases the memory cell ground voltage applied to the ground node Ns of the memory cell to which data is to be written during the period P2. As a result, during the period P1, the current capability ratios (QLa/QAa) and (QLb/QAb) decrease, whereby the write operation margin can be improved. During the period P2, the current capability ratios (QLa/QAa) and (QLb/QAb) increase, whereby the write failure can be reduced or prevented.

Note that the control circuit 31 of FIG. 10 may further include the power supply voltage control circuits 103-1 and 103-2 of FIG. 1, the word line drive circuits 105-1 and 105-2 of FIG. 6, and the substrate voltage control circuits 203-1 and 203-2 of FIG. 7.

(Potential Setting Period of Bit Line Pair)

Figure 13:
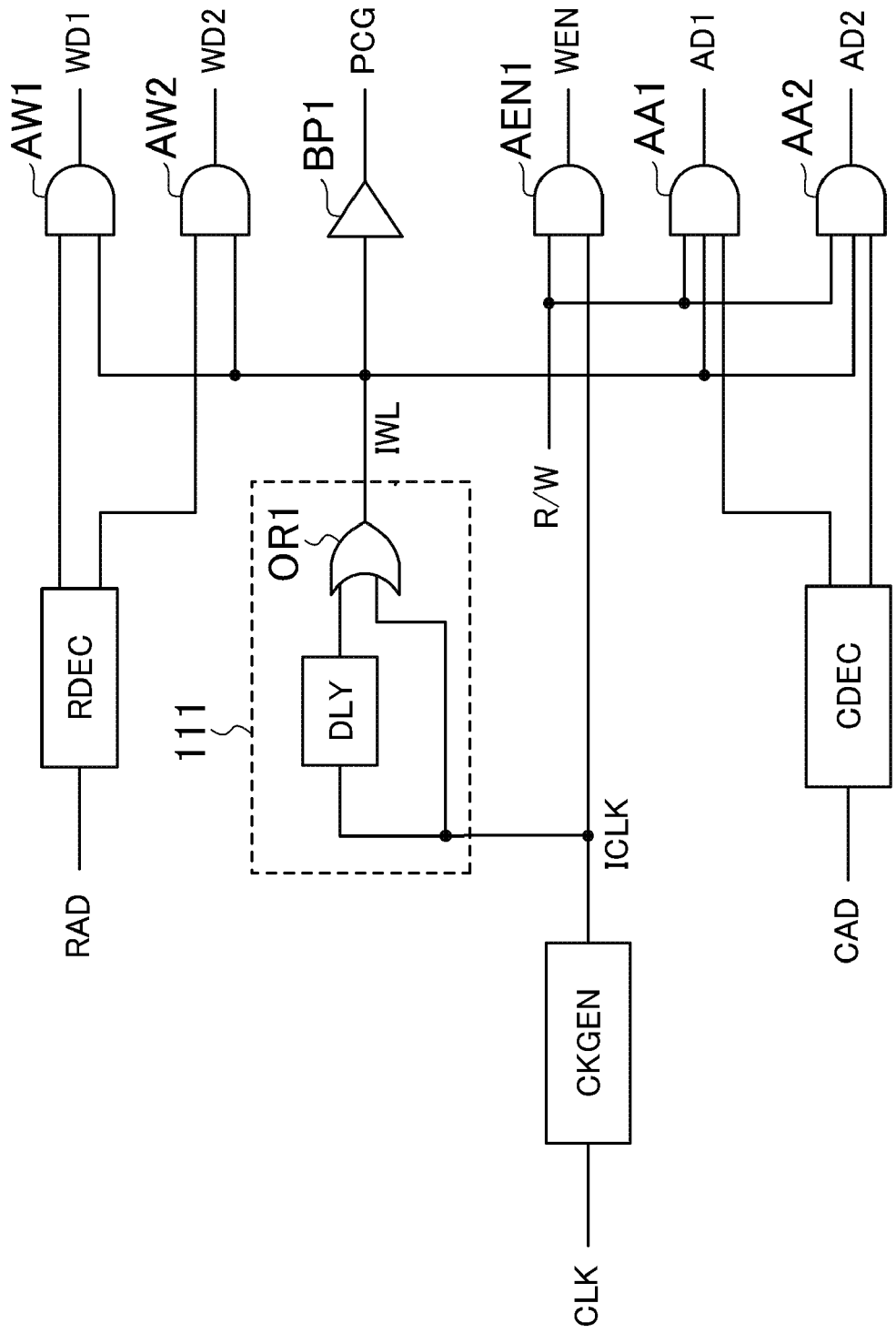
FIG. 13 is a diagram for describing a first variation of the control signal generation circuit.
Figure 14:
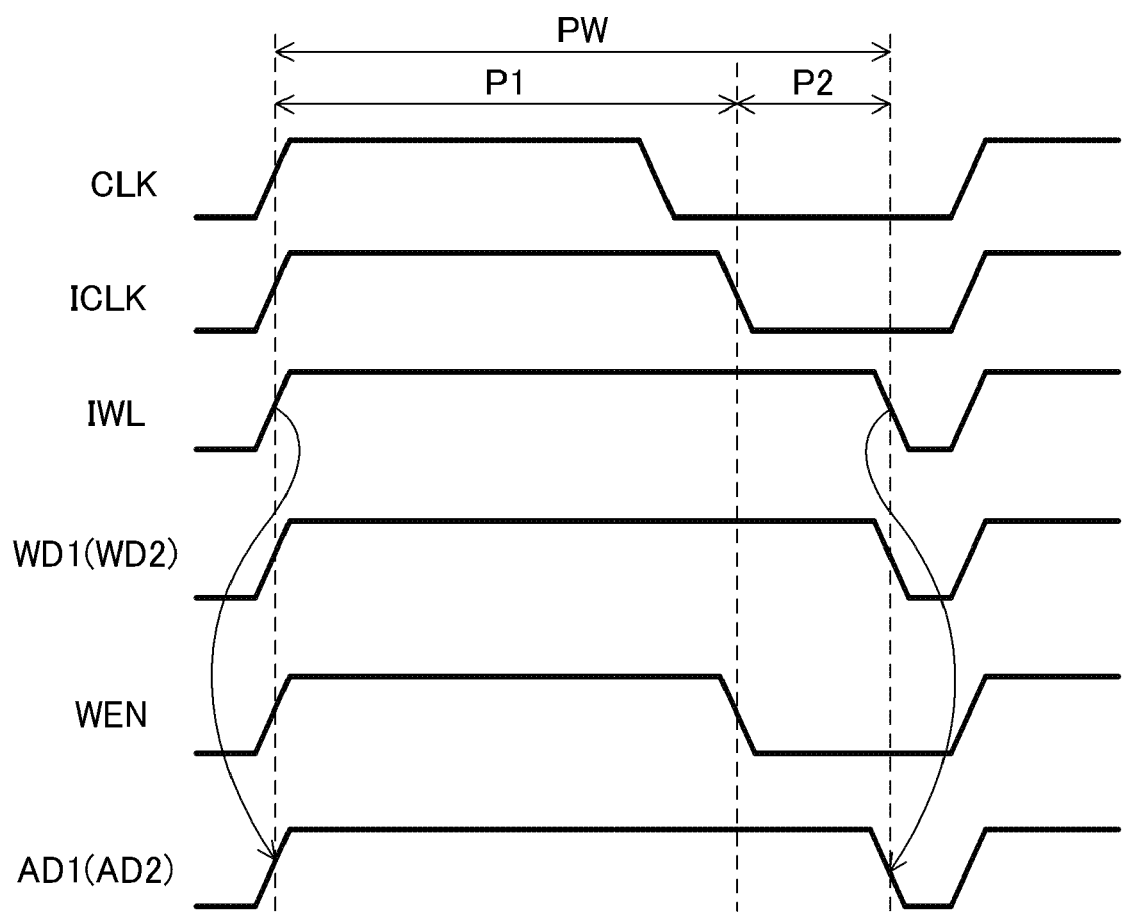
FIG. 14 is a diagram for describing operation of the control signal generation circuit of FIG. 13.

In each of the above embodiments, a period during which the potentials of a bit line pair are set to be equal to potentials corresponding to the data signals DINa and DINb (i.e., the high-level period of the column address signal) may be longer than the period P1. For example, the control circuits 11, 21, and 31 may each include a control signal generation circuit 101a shown in FIG. 13 instead of the control signal generation circuit 101. In the control signal generation circuit 101a of FIG. 13, the internal word line signal IWL is applied to the AND circuits AA1 and AA2 instead of the internal clock signal ICLK. Specifically, as shown in FIG. 14, the high-level periods of the column address signals AD1 and AD2 are equal to that of the internal word line signal IWL.

As described above, by causing the potential setting of the bit line pair during the period P1 to continue during the period P2, the potentials of the bit line pair can be caused to be stable during the period P2, whereby the write operation can be reliably performed (the potentials of the memory nodes Na and Nb can be reliably set to be equal to the potentials of the bit line pair). In particular, as the wiring length of a bit line is shorter (the capacitance of the bit line is smaller), the potential of the bit line is more easily changed by external disturbance. Therefore, it is advantageous to continue to hold the potential setting of the bit line pair during the period P2. Note that the control signal generation circuit 101a of FIG. 13 is configured so that the internal word line signal IWL is supplied to the AND circuits AA1 and AA2 which generate the column address signals AD1 and AD2. Therefore, the control signal generation circuit 101a of FIG. 13 has a larger load at the node of the internal word line signal IWL and a lower operating speed than those of the control signal generation circuit 101 of FIG. 2 (the internal clock signal ICLK is supplied to the AND circuits AA1 and AA2). The operating speed is, however, less affected when the bit line is short.

(Setting of Period and Amount of Decrease in Current Capability)

Also, in each of the above embodiments, the length of the period P1, the length of the period P2, and the amounts of decrease in the current capabilities of the load transistors QLa and QLb (e.g., the amount of decrease in the memory cell power supply voltage, the amount of increase in the substrate voltage, the amount of increase in the memory cell ground voltage, etc.) are preferably set so that the potential of the memory node Nb (Na) can be decreased from the high level to the low level during the period P1, and the potential of the memory node Na (Nb) can be increased from the intermediate potential Vx to the high level during the period P2. By such settings, the write failure occurring in a memory cell to which data is to be written can be reliably reduced or prevented.

Note that the lengths of the periods P1 and P2 may be set, depending on the amounts of decrease in the current capabilities of the load transistors QLa and QLb during the period P1. As the decreases in the current capabilities of the load transistors QLa and QLb during the period P1 increase, the potential of the memory node Nb (Na) is more easily decreased from the high level to the low level during the period P1 while it is more difficult to increase the potential of the memory node Na (Nb) from the low level to the high level during the period P2. Therefore, the lengths of the periods P1 and P2 are preferably set so that as the amounts of decrease in the load transistors QLa and QLb during the period P1 increase, the period P1 decreases (or the period P2 increases).

Similarly, the amounts of decrease in the current capabilities of the load transistors QLa and QLb may be set, depending on the lengths of the periods P1 and P2. For example, as the period P1 increases (or the period P2 decreases), the amounts of decrease in the current capabilities of the load transistors QLa and QLb are preferably decreased.

The lengths of the periods P1 and P2 may be set, depending on the threshold voltages of the load transistors QLa and QLb. As the threshold voltages of the load transistors QLa and QLb decrease, it is more difficult to decrease the potential of the memory node Nb (Na) from the high level to the low level during the period P1 while the potential of the memory node Na (Nb) is more easily increased from the low level to the high level during the period P2. Therefore, the lengths of the periods P1 and P2 may be preferably set so that as the threshold voltages of the load transistors QLa and QLb decrease, the period P1 increases (or the period P2 decreases).

(Adjustment of Period Length)

The lengths of the periods P1 and P2 may be variable. For example, the control circuits 11, 21, and 31 may include a control signal generation circuit 101b of FIG. 15 instead of the control signal generation circuit 101. The control signal generation circuit 101b of FIG. 15 includes an internal word line signal generation circuit 111a and a timing control circuit 121 instead of the internal word line signal generation circuit 111 of FIG. 2.

As with the internal word line signal generation circuit 111, the internal word line signal generation circuit 111a generates the internal word line signal IWL based on the internal clock signal ICLK. The internal word line signal generation circuit 111a includes a delay circuit DLYa including delay buffers D1, D2, and D3 coupled in cascade, and an OR circuit OR1 which performs a logical OR operation of the internal clock signal ICLK and the output of the delay circuit DLYa and then outputs the result as the internal word line signal IWL.

The timing control circuit 121 generates a clock signal DCLK based on the internal clock signal ICLK, and changes the length of the high-level period of the clock signal DCLK in response to timing control signals TC1, TC2, and TC3. For example, the timing control circuit 121 includes an AND circuit A1 which performs a logical AND operation of the output of the delay buffer D1 and the timing control signal TC1 and then outputs the result, an AND circuit A2 which performs a logical AND operation of the output of the delay buffer D2 and the timing control signal TC2 and then outputs the result, an AND circuit A3 which performs a logical AND operation of the output of the delay buffer D3 and the timing control signal TC3 and then outputs the result, and an OR circuit OR2 which performs a logical OR operation of the internal clock signal ICLK and the outputs of the AND circuits A1, A2, and A3 and then outputs the result as the clock signal DCLK. The clock signal DCLK is supplied to the AND circuits AEN1, AA1, and AA2 instead of the internal clock signal ICLK.

Figure 16:
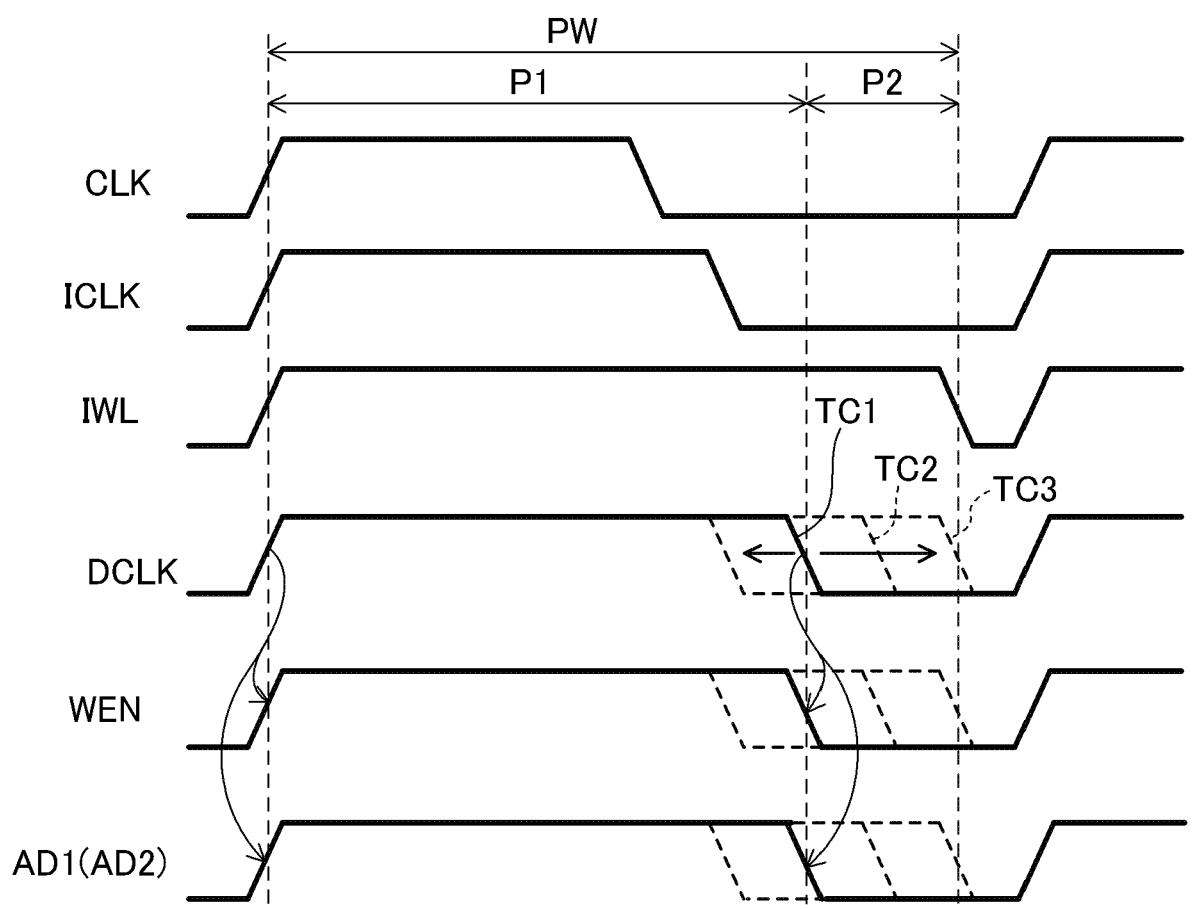
FIG. 16 is a diagram for describing operation of the control signal generation circuit of FIG. 15.
Figure 17:
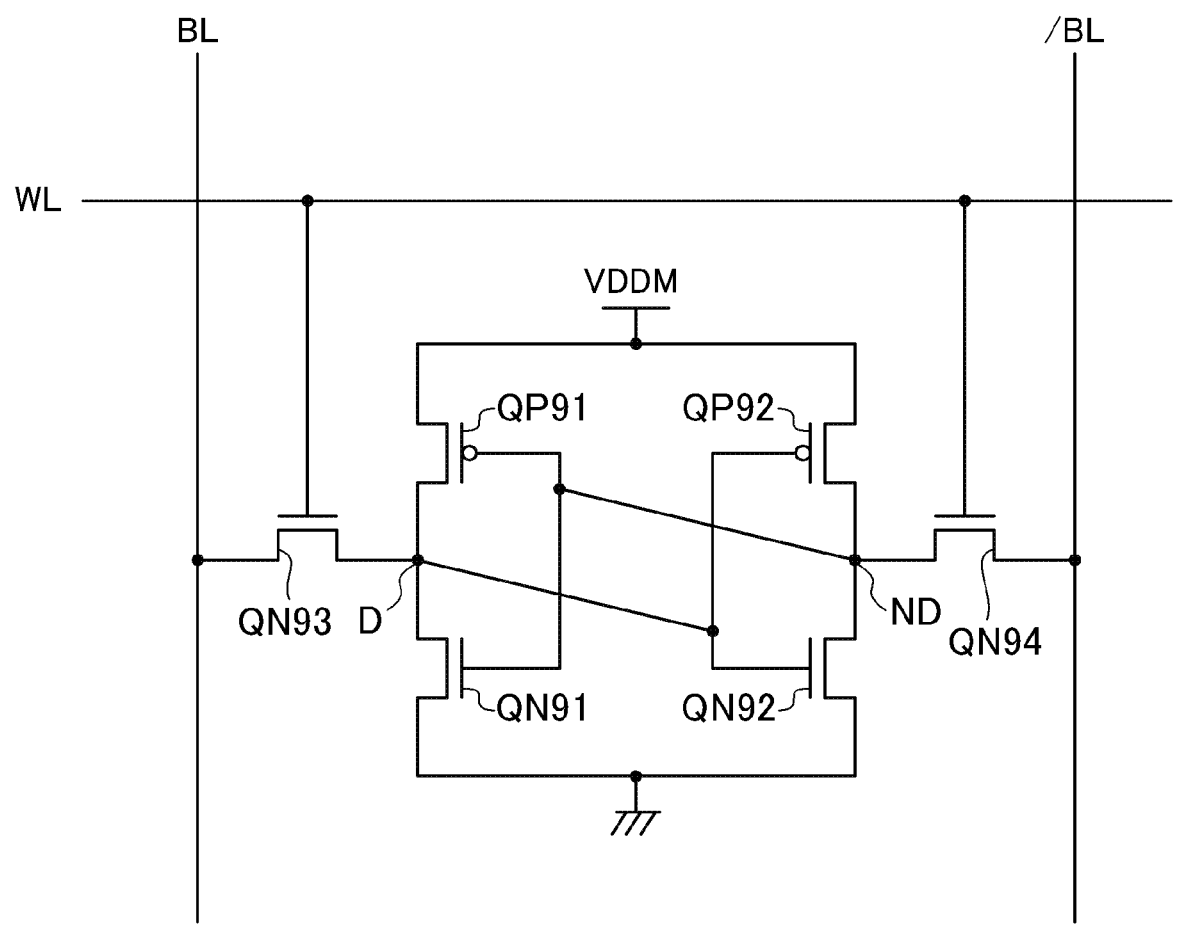
FIG. 17 is a diagram for describing an SRAM memory cell.
Figure 18:
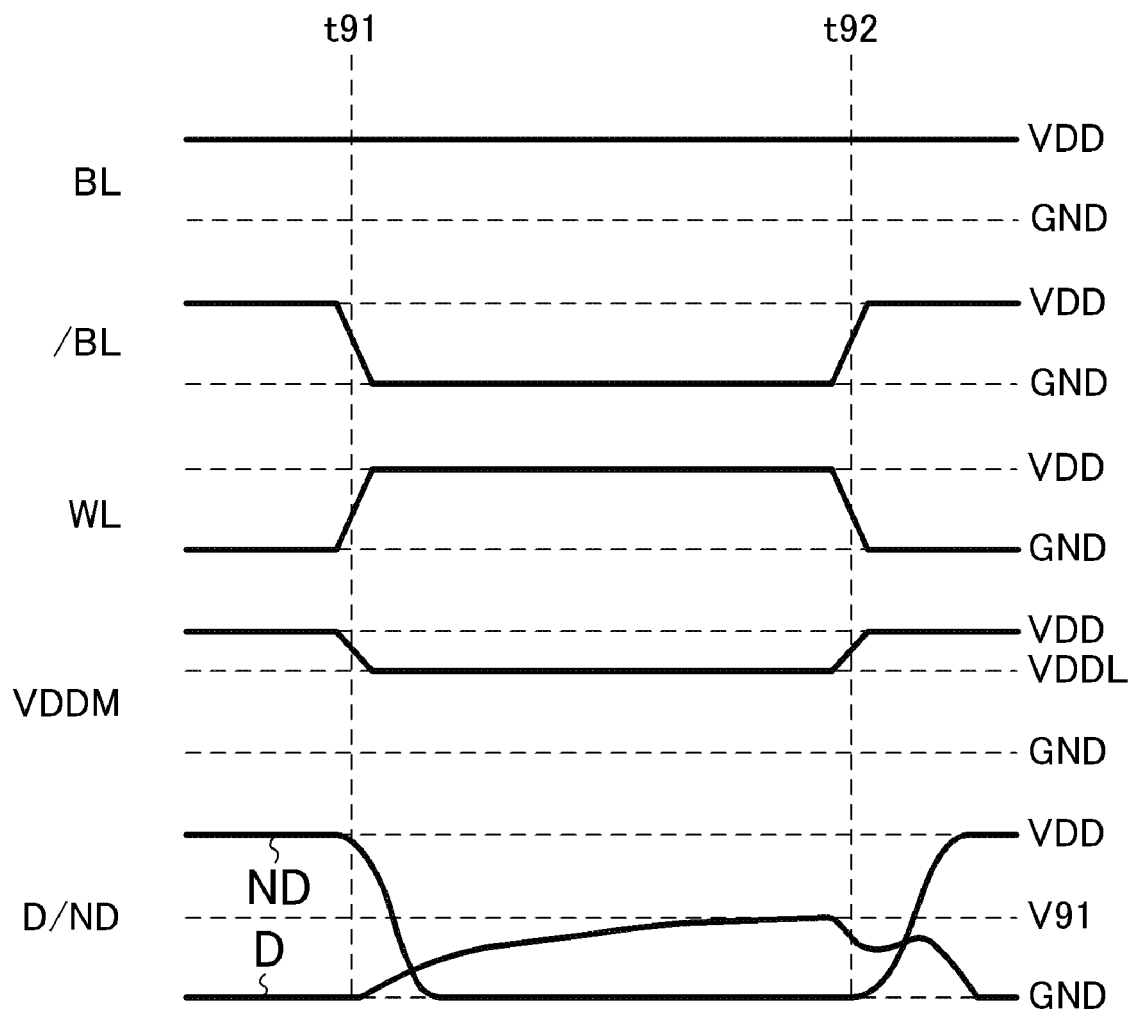
FIG. 18 is a diagram for describing a write failure in the memory cell of FIG. 17.

As shown in FIG. 16, when the timing control signal TC1 set to be at the high level and the timing control signals TC2 and TC3 are set to be at the low level, the high-level period of the clock signal DCLK is equal to a period which is obtained by adding a delay time in the delay buffer D1 to the high-level period of the internal clock signal ICLK. When the timing control signals TC1, TC2, and TC3 are all set to be at the low level, the high-level period of the clock signal DCLK is equal to that of the internal clock signal ICLK. Thus, by selectively setting the timing control signals TC1, TC2, and TC3 to be at the high level, the high-level period of the clock signal DCLK can be changed. As a result, the lengths of the high-level periods of the write enable control signal WEN and the column address signals AD1 and AD2 can be adjusted, whereby the lengths of the periods P1 and P2 can be adjusted.

As described above, by causing the periods P1 and P2 to be variable, the periods P1 and P2 can be appropriately adjusted, depending on the amounts of decrease in the current capabilities of the load transistors QLa and QLb, the threshold voltages of the load transistors QLa and QLb, etc. For example, the lengths of the periods P1 and P2 may be adjusted based on the actual amounts of decrease in the current capabilities of the load transistors QLa and QLb which are obtained by a detection circuit (not shown) which detects such amounts of decrease. As a result, a degradation in the write operation margin which is caused by variations in circuit operation can be reduced. Alternatively, the lengths of the periods P1 and P2 may be adjusted based on information about variations in the threshold voltages of the load transistors QLa and QLb which are obtained by a detection circuit (not shown) which detects such threshold voltages. As a result, a degradation in the write margin which is caused by manufacture variations can be reduced.

Figure 15:
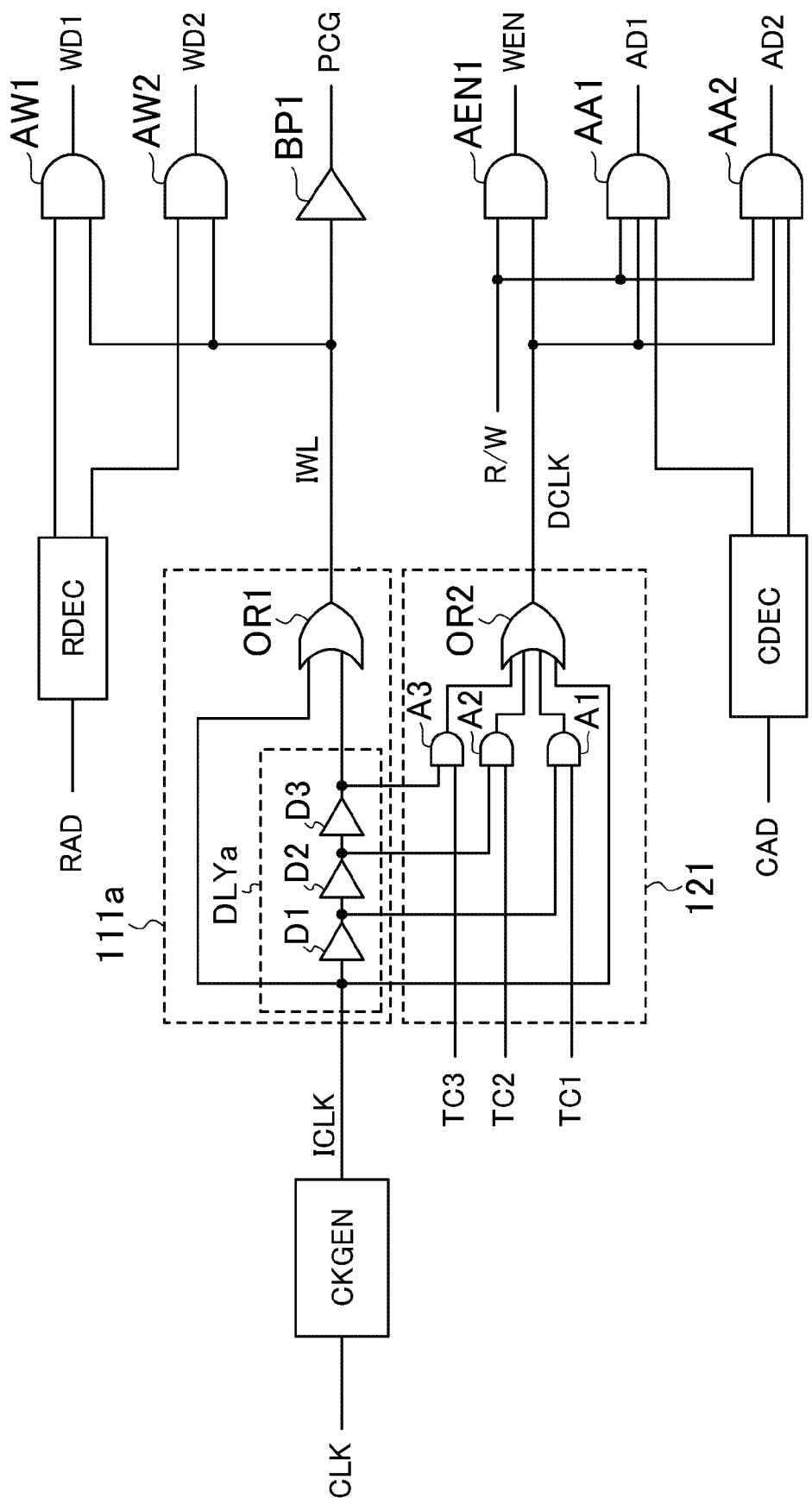
FIG. 15 is a diagram for describing a second variation of the control signal generation circuit.

In the control signal generation circuit of FIG. 15, the length of the word line drive period PW is constant, and therefore, the lengths of the periods P1 and P2 can be adjusted without extending the write operation period.

Moreover, by setting the lengths of the periods P1 and P2 during inspection to be different from those of the periods P1 and P2 in actual use, the write operation margin can be improved. For example, memory cells may be inspected in terms of an operational failure where the period P1 is set to be longer than in actual use. A memory cell which it has been determined that has an operational failure may be replaced with another memory cell which it is not determined that has an operational failure, by a redundancy replacement technique. As a result, a margin for operation of increasing the potential of a memory node from the low level to the high level can be ensured. Alternatively, memory cells may be inspected in terms of an operational failure where the length of the period P2 is set to be longer than in actual use. A memory cell which it has been determined that has an operational failure may be replaced with another memory cell which it is not determined that has an operational failure, by a redundancy replacement technique. As a result, a margin for operation of decreasing the potential of a memory node from the high level to the low level can be ensured. Thus, an operational failure of a memory cell which is caused by manufacture variations can be reduced.

Note that the high-level periods of the write enable control signal WEN and the column address signals AD1 and AD2 may be set to be constant, and the high-level periods of the word line drive voltages WD1 and WD2 and the precharge control signal PCG may be set to be variable. For example, in the control signal generation circuit 101 of FIG. 2, the delay time in the delay circuit DLY may be set to be variable. Alternatively, the high-level periods of the word line drive voltages WD1 and WD2, the precharge control signal PCG, the write enable control signal WEN, and the column address signals AD1 and AD2 may be set to be variable. For example, in the control signal generation circuit 101b of FIG. 15, the delay time in the delay circuit DLYa may be set to be variable. In any of these cases, the lengths of the periods P1 and P2 can be set to be variable.

In each of the above embodiments, a plurality of memory cells may be subjected to write operation. For example, both the memory cells MC1 and MC2 corresponding to the word line WL1 may be subjected to write operation.

As described above, the semiconductor memory device can ensure the write operation margin and reduce or prevent the write failure (data re-reversal), and therefore, is useful for memory devices which are incorporated into electronic apparatuses.

Note that the above embodiments are merely exemplary in nature and are in no way intended to limit the scope of the present disclosure, its application, or uses.

What is claimed is:

1. A semiconductor memory device comprising:
   n pairs, n being an integer of two or more, of bit lines;
   m word lines, m being an integer of two or more;
   n×m memory cells provided at intersections of the n pairs of bit lines and the m word lines; and
   a control circuit,
   wherein
   each of the n×m memory cells includes
      a first access transistor coupled between one of the pair of bit lines corresponding to the memory cell and a first memory node of the memory cell,
      a second access transistor coupled between the other of the pair of bit lines corresponding to the memory cell and a second memory node of the memory cell,
      a first load transistor and a second load transistor coupled between a power supply node of the memory cell to which a memory cell power supply voltage is applied, and the first and second memory nodes of the memory cell, respectively, and
      a first drive transistor and a second drive transistor coupled between a ground node of the memory cell to which a memory cell ground voltage is applied, and the first and second memory nodes of the memory cell, respectively,
   in each of the n×m memory cells, the first and second access transistors each have a gate coupled to one of the m word lines which corresponds to the memory cell, the first load transistor and the first drive transistor each have a gate coupled to the second memory node of the memory cell, and the second load transistor and the second drive transistor each have a gate coupled to the first memory node of the memory cell, and
   the control circuit supplies a word line drive voltage to one of the m word lines which corresponds to one or more of the n×m memory cells to which data is to be written during a word line drive period including a first period and a second period following the first period, to decrease current capabilities of the first and second load transistors included in the memory cell during the first period, and increase the current capabilities of the first and second load transistors during the second period.

2. The semiconductor memory device of claim 1, wherein the word line drive voltage is lower than a memory cell power supply voltage applied to one or more to which data is not to be written of some of the n×m memory cells which correspond to one of the m word lines to which the word line drive voltage is supplied.

3. The semiconductor memory device of claim 1, wherein the control circuit does not change the current capabilities of the first and second load transistors included in one or more of the n×m memory cells to which data is not to be written and which corresponds to the same word line as that of one or more of the n×m memory cells to which data is to be written, during the first and second periods.

4. The semiconductor memory device of claim 1, wherein the control circuit decreases a memory cell power supply voltage applied to the power supply node of one or more of the n×m memory cells to which data is to be written during the first period, and increases the memory cell power supply voltage during the second period.

5. The semiconductor memory device of claim 1, wherein the control circuit increases a substrate voltage applied to substrates of the first and second load transistors included in one or more of the n×m memory cells to which data is to be written during the first period, and decreases the substrate voltage during the second period.

6. The semiconductor memory device of claim 1, wherein the control circuit decreases a memory cell ground voltage applied to the ground node of one or more of the n×m memory cells to which data is to be written during the first period, and decreases the memory cell ground voltage during the second period.

7. The semiconductor memory device of claim 1, wherein the control circuit sets the pair of bit lines corresponding to one or more of the n×m memory cells to which data is to be written to have a potential corresponding to write data during the first period, and cancels the potential setting of the pair of bit lines during the second period.

8. The semiconductor memory device of claim 1, wherein the control circuit sets the pair of bit lines corresponding to one or more of the n×m memory cells to which data is to be written to have a potential corresponding to write data during the first and second periods, and cancels the potential setting of the pair of bit lines after the second period has elapsed.

9. The semiconductor memory device of claim 1, wherein at least one of the first and second periods have a variable length.

10. The semiconductor memory device of claim 1, wherein the first and second periods each have a length which is set, depending on a difference between the current capabilities of the first and second load transistors during the first period and the current capabilities of the first and second load transistors during the second period.

11. The semiconductor memory device of claim 1, wherein the first and second periods each have a length which is set, depending on threshold voltages of the first and second load transistors.

12. A semiconductor memory device comprising:
a plurality of memory cells each including a flip-flop circuit; and
a control circuit configured to decrease a data holding capability of the flip-flop circuit included in one or more of the plurality of memory cells to which data is to be written during start of write operation, and increase the data holding capability of the flip-flop circuit during a predetermined period prior to the end of the write operation.

13. The semiconductor memory device of claim 12, further comprising:
a plurality of pairs of bit lines; and
a plurality of word lines,
wherein
the plurality of memory cells are arranged at intersections of the plurality of pairs of bit lines and the plurality of word lines,
each of the plurality of memory cells includes
a first access transistor coupled between one of the pair of bit lines corresponding to the memory cell and a first memory node of the flip-flop circuit, and having a gate coupled to one of the plurality of word lines corresponding to the memory cell, and
a second access transistor coupled between the other of the pair of bit lines corresponding to the memory cell and a second memory node of the flip-flop circuit, and having a gate coupled to one of the plurality of word lines corresponding to the memory cell, and
the control circuit activates one of the plurality of word lines corresponding to one or more of the plurality of memory cells to which data is to be written, to perform the write operation.

14. The semiconductor memory device of claim 13, wherein
the word line has a high-level potential which is lower than a memory cell power supply voltage applied to one or more of the plurality of memory cells which performs data holding operation during the write operation.

* * * * *